United States Patent
Hayata et al.

(10) Patent No.: US 7,265,711 B2
(45) Date of Patent: Sep. 4, 2007

(54) HIGH-FREQUENCY OSCILLATOR, HIGH-FREQUENCY TRANSMISSION-RECEPTION APPARATUS USING THE SAME, RADAR APPARATUS, AND RADAR-APPARATUS-EQUIPPED VEHICLE AND SMALL BOAT EQUIPPED WITH THE SAME

(75) Inventors: Kazuki Hayata, Kyoto (JP); Yuji Kishida, Kyoto (JP)

(73) Assignee: Kyocera Corporation, Kyoto (JP)

( * ) Notice: Subject to any disclaimer, the term of this patent is extended or adjusted under 35 U.S.C. 154(b) by 242 days.

(21) Appl. No.: 11/169,222

(22) Filed: Jun. 28, 2005

(65) Prior Publication Data

US 2006/0017606 A1    Jan. 26, 2006

(30) Foreign Application Priority Data

Jun. 29, 2004    (JP)  ........................... P2004-191732

(51) Int. Cl.
 *G01S 7/28*    (2006.01)
(52) U.S. Cl. ................ 342/175; 342/70; 342/41; 342/132; 342/134; 331/1 R; 331/107 DP
(58) Field of Classification Search ............ 342/70–72, 342/41, 175, 132–135; 331/1 R, 4, 107 DP
See application file for complete search history.

(56) References Cited

U.S. PATENT DOCUMENTS

| | | | | |
|---|---|---|---|---|
| 4,009,448 | A * | 2/1977 | Hopwood et al. ............. | 331/4 |
| 4,142,187 | A * | 2/1979 | Nakayama ................... | 340/554 |
| 4,291,279 | A * | 9/1981 | Buck ........................... | 330/287 |
| 6,147,567 | A * | 11/2000 | Welland et al. ............. | 331/179 |
| 6,965,761 | B2 * | 11/2005 | Welland et al. ............. | 455/262 |
| 2003/0016090 | A1 * | 1/2003 | Kobayashi et al. .......... | 331/158 |
| 2004/0183610 | A1 * | 9/2004 | Seppinen et al. ....... | 331/177 V |
| 2004/0263270 | A1 * | 12/2004 | Hashimoto .............. | 331/117 R |

(Continued)

FOREIGN PATENT DOCUMENTS

JP      06-268445      9/1994

(Continued)

OTHER PUBLICATIONS

"Linear crystal controlled FM source for mobile radio application", Arakelian, R.; Driscoll, M.M. Vehicular Technology, IEEE Transactions on vol. 27, Issue 2, May 1978 pp. 43-50.*

*Primary Examiner*—John B. Sotomayor
(74) *Attorney, Agent, or Firm*—Hogan & Hartson LLP

(57) ABSTRACT

A high-frequency oscillator that can tune oscillation characteristics is provided. A high-frequency oscillator includes a Gunn diode serving as a high-frequency oscillation element that generates high-frequency signals, a resonator connected to the Gunn diode, a varactor diode serving as a variable-capacitance element that is disposed on the resonator and changes a resonance frequency, and a bias supply circuit that is connected to the varactor diode and supplies a bias voltage applied in order to change a capacitance. The bias supply circuit includes a trimmable chip resistor serving as a pre-set variable resistor that regulates a bias voltage applied to the varactor diode. By regulating the resistance value of the trimmable chip resistor, it is possible to control the capacitance value of the varactor diode and tune oscillation characteristics to a desired state.

19 Claims, 17 Drawing Sheets

U.S. PATENT DOCUMENTS

| | | | |
|---|---|---|---|
| 2005/0084053 A1* | 4/2005 | Rohde et al. | 375/376 |
| 2005/0088336 A1* | 4/2005 | Sakamoto et al. | 342/175 |
| 2005/0190101 A1* | 9/2005 | Hiramatsu et al. | 342/175 |
| 2005/0242896 A1* | 11/2005 | Rohde et al. | 331/179 |
| 2006/0017606 A1* | 1/2006 | Hayata et al. | 342/41 |

FOREIGN PATENT DOCUMENTS

| | | |
|---|---|---|
| JP | 06-268446 | 9/1994 |
| JP | 06-268447 | 9/1994 |
| JP | 06-291552 | 10/1994 |
| JP | 2000-258525 | 9/2000 |
| JP | 2003-035768 | 2/2003 |
| JP | 2006050580 A * | 2/2006 |

* cited by examiner

INTERMEDIATE FREQUENCY
OUTPUT

INTERMEDIATE FREQUENCY OUTPUT

INTERMEDIATE FREQUENCY SIGNAL OUTPUT

HIGH-FREQUENCY OSCILLATOR, HIGH-FREQUENCY TRANSMISSION-RECEPTION APPARATUS USING THE SAME, RADAR APPARATUS, AND RADAR-APPARATUS-EQUIPPED VEHICLE AND SMALL BOAT EQUIPPED WITH THE SAME

BACKGROUND OF THE INVENTION

1. Field of the Invention

The present invention relates to a high-frequency oscillator for use in a millimeter-wave integrated circuit, a millimeter-wave radar module or the like, and specifically, to a high-frequency oscillator in which a bias supply circuit of a variable-capacitance element as a component of the high-frequency oscillator is provided with a pre-set variable resistor, and which can tune oscillation characteristics such as an oscillation frequency and a frequency modulation width to a desired state with the pre-set variable resistor, and to a high-frequency transmission-reception apparatus using the high-frequency oscillator.

Further, the invention relates to a radar apparatus comprising the aforementioned high-frequency transmission-reception apparatus, and to a radar-apparatus-equipped vehicle and a radar-apparatus-equipped small boat that are equipped with the radar apparatus.

2. Description of the Related Art

Since before, a high-frequency oscillator which is integrated and used in a millimeter-wave integrated circuit, a millimeter-wave radar module or the like, for example, as shown by a schematic cross section view in FIG. 16 is known. The high-frequency oscillator shown in FIG. 16 is provided with: a waveguide tube 51 whose one end is short-circuited as a short-circuit end 51a and whose other end is opened as an output end 51b; a Gunn diode 52 that is disposed in the tube in midway of the short-circuit end 51a and the output end 51b of the waveguide tube 51, and that generates high-frequency signals; a bias supply circuit 53 for applying a bias voltage to the Gunn diode 52; a varactor diode 55 serving as a variable-capacitance element, which is disposed on a resonator 54 configured by a portion between the short-circuit end 51a of the waveguide tube 51 among the waveguide tube 51 and the part on which the Gunn diode 52 is disposed; and a bias supply circuit 56 for applying a bias voltage to the varactor diode 55.

Until now, the bias supply circuit 56 used in the high-frequency oscillator as described above is provided with, for example, a fixed resistor such as a chip resistor, and a bias voltage applied to the varactor diode 55 was set depending on the resistance value of the fired resistor.

The high-frequency oscillator as an example of the conventional one can generate high-frequency signals of a millimeter-waveband from the Gunn diode 52 by applying a bias voltage from the bias supply circuit 53 to the Gunn diode 52, resonate the high-frequency signals in the resonator 54, and output high-frequency signals of a frequency of, for example, 77 GHz from the output end 51b of the waveguide tube 51. On this occasion, it is possible to change the frequency of output high-frequency signals by changing the capacitance value of the varactor diode 55 disposed on the resonator 54. It is possible to change the capacitance value of varactor diode 55 by a bias voltage applied to the varactor diode 55. That is to say, by controlling a bias voltage outputted from the bias supply circuit 56 and applied to the varactor diode 55, it is possible to control the oscillation frequency of the high-frequency oscillator, and, for example, by providing the bias supply circuit 56 with a modulation signal source that generates voltage signals such as triangular waves as modulation signals, it is possible to cause to output frequency-modulated high-frequency signals from the high-frequency oscillator.

Further, the high-frequency oscillator as the example of the conventional one may use a nonradiative dielectric waveguide (also referred to as an NRD guide hereinafter) as a high-frequency transmission line instead of the waveguide tube 51, and such conventional examples are disclosed in, for example, Japanese Unexamined Patent Publication JP-A 6-268445 (1994), Japanese Unexamined Patent Publication JP-A 6-268446 (1994), Japanese Unexamined Patent Publication JP-A 6-268447 (1994) and Japanese Unexamined Patent Publication JP-A 6-291552 (1994).

The basic configuration of the nonradiative dielectric waveguide is, as shown by a partially cutaway perspective view in FIG. 17, a configuration such that a dielectric line 63 whose cross section shape in one virtual plane perpendicular to a direction in which a line extends, is a rectangular shape such as a rectangle is placed between parallel flat plate conductors 61, 62 placed in parallel at a predetermined space a, and in the case where the relation between the predetermined space a and a wavelength λ of high-frequency signals is a $\leq \lambda/2$, it is possible to avoid penetration of noise into the dielectric line 63 from the outside as well as avoid radiation of high-frequency signals to the outside, and make high-frequency signals propagate in the dielectric line 63 with efficiency. The wavelength A of high-frequency signals is a wavelength in the air (free space) at a used frequency.

Furthermore, the conventional high-frequency oscillator is, for example, as disclosed in Japanese Unexamined Patent Publication JP-A-2000-258525, integrated into a high-frequency transmission-reception apparatus that transmits and receives high-frequency signals, and moreover, used in a radar apparatus into which the high-frequency transmission-reception apparatus is integrated. In the high-frequency transmission-reception apparatus or the radar apparatus, the high-frequency oscillator operates so as to generate high-frequency signals of, for example, a millimeter-waveband and output high-frequency signals obtained by subjecting the generated high-frequency signals to frequency-modulation such that the frequency repeatedly ascends and descends between the lower limit value and the upper limit value of the frequency in a specific frequency range. Then, an operation such that the high-frequency signals outputted from the high-frequency oscillator are additionally pulse-modulated by a modulator and outputted as transmission high-frequency signals from an antenna is performed. There is also a case where high-frequency signals outputted from the high-frequency oscillator are outputted as transmission high-frequency signals as they are.

Still further, an example of a conventional radar apparatus and a radar-apparatus-equipped vehicle equipped with the radar apparatus is disclosed in, for example, JP-A-2003-35768.

However, the conventional high-frequency oscillator and the high-frequency oscillators as disclosed in JP-A 6-268445 (1994), JP-A 6-268446 (1994), JP-A 6-268447 (1994) and JP-A 6-291552 (1994) have a problem that subtle differences in connection states and operation states (referred to as load conditions) of the high-frequency transmission line connected to the output end of the high-frequency oscillator and other high-frequency circuit elements easily cause a change of oscillation characteristics such as an oscillation frequency and a frequency modulation width, and therefore, it is hard to stably obtain desired oscillation characteristics. The frequency modulation width means a width in which a frequency is changed in the frequency modulation.

Further, the high-frequency transmission-reception apparatus using the high-frequency oscillator as described above has a problem that at the time of mass-production thereof, load conditions of the high-frequency circuit elements connected to the high-frequency oscillators and load characteristics of the high-frequency oscillators themselves may be individually different, the integrated high-frequency oscillators are hard to have desired oscillation characteristics, and therefore, it is difficult to stably obtain a good transmission-reception performance.

A radar apparatus disclosed in JP-A 2000-258525 also needs to use the high-frequency oscillator as described above, and have same problem as mentioned above.

SUMMARY OF THE INVENTION

In consideration of the abovementioned circumstances, an object of the invention is to provide a high-frequency oscillator that can tune oscillation characteristics such as an oscillation frequency and a frequency modulation width with a bias supply circuit of a variable-capacitance element as a component of the high-frequency oscillator and can stably exhibit good oscillation characteristics, and provide a high-performance high-frequency transmission-reception apparatus using the high-frequency oscillator.

Further, another object of the invention is to provide a radar apparatus comprising the high-performance high-frequency transmission-reception apparatus described above, and provide a vehicle and a small boat that are equipped with the radar apparatuses.

The invention provides a high-frequency oscillator comprising:

a high-frequency oscillation element for generating high-frequency signals;

a variable-capacitance element of which capacitance changes by applying a bias voltage;

a resonator connected to the high-frequency oscillation element, of which oscillation frequency changes along with the change of the capacitance of the variable-capacitance element; and a bias supply circuit connected to the variable-capacitance element, for supplying a bias voltage to be applied to the variable-capacitance element the bias supply circuit including a pre-set variable resistor for regulating the bias voltage.

According to the high-frequency oscillator of the invention, the bias supply circuit supplies a bias voltage to the variable-capacitance element, thereby the capacitance of the variable-capacitance element changes, and the resonance frequency of a resonance circuit changes, so that it is possible to change the characteristics of high-frequency signals given to the resonator from the high-frequency oscillation element connected to the resonator, and consequently, it is possible to change the oscillation characteristics of the high-frequency signals. The variable-capacitance element changes the capacitance thereof depending on the magnitude of the bias voltage applied thereto. The bias voltage applied to the variable-capacitance element changes depending on a resistance of a pre-set variable resistor that regulates the bias voltage. When the value of the bias voltage is properly set by the pre-set variable resistor at the time of regulation of oscillation characteristics, an operation is conducted so that the once set value of the bias voltage is kept at other times, for example after a completion of manufacturing an apparatus by use of the high-frequency oscillator.

Consequently, a high-frequency oscillator can tune the oscillation characteristics of the high-frequency oscillation element so as to become optimum with the variable-capacitance element whose capacitance is regulated to a proper one by the bias supply circuit, and moreover, can stably maintain the good oscillation characteristics.

Further, in the invention, it is preferable that the pre-set variable resistor is composed of a trimmable chip resistor.

According to the high-frequency oscillator of the invention, in the above configuration, in the case where the pre-set variable resistor is composed of a trimmable chip resistor, it stably keeps a set resistance value even if external forces such as vibrations are applied from outside after regulation of the resistance value because the trimmable chip resistor does not have a movable part, with the result that a high-frequency oscillator that can stably and securely maintain good oscillation characteristics is realized.

Furthermore, in the invention, it is preferable that the bias supply circuit includes a test terminal for applying a test bias voltage to the variable-capacitance element.

According to the high-frequency oscillator of the invention, in each of the above configurations, in the case where the bias supply circuit includes a test terminal for applying a test bias voltage to the variable-capacitance element, a test voltage is inputted to the test terminal, and it is thereby possible to accurately know in advance a bias voltage that should be applied to the variable-capacitance element of the high-frequency oscillator when it is integrated into a high-frequency transmission-reception apparatus, with the result that a high-frequency oscillator that can accurately and securely set a resistance value that should be set in the pre-set variable resistor without taking time for regulation is realized. Besides, since a resistance value that should be set in the pre-set variable resistor can be obtained from the value of a bias voltage that should be set even if the pre-set variable resistor is one that cannot change a resistance value reversibly, a high-frequency oscillator that can securely set a resistance value that should be set in the pre-set variable resistor is realized.

The invention provides a high-frequency transmission-reception apparatus comprising:

the high-frequency oscillator described above;

a selecting device having two output portions, connected to the high-frequency oscillator, for selectively outputting high-frequency signals given by the high-frequency oscillator from one or both of the output portions;

a signal separating device having a first terminal, a second terminal and a third terminal, for receiving at the first terminal the transmission high-frequency signals from the selecting device, for outputting from the second terminal the high-frequency signals inputted from the first terminal, and for outputting from the third terminal high-frequency signals inputted from the second terminal;

a transmission-reception antenna connected to the second terminal; and a mixer connected to the other output portion and the third terminal, for mixing high-frequency signals outputted from the other output portion and high-frequency signals received by the transmission-reception antenna and outputting intermediate frequency signals.

According to the invention, high-frequency signals oscillated from the high-frequency oscillator are given to the selecting device. The selecting device selectively outputs the high-frequency signals given by the high-frequency oscillator from the one output portion and the other output portion, and the high-frequency signals outputted from the one output portion are given to the first terminal of the signal separating device as transmission high-frequency signals. The signal separating device outputs the transmission high-frequency signals given to the first terminal, from the second terminal, and the transmission high-frequency signals are radiated as radio waves from the transmission-reception antenna connected to the second terminal. The high-frequency signals received by the transmission-reception antenna are given to the second terminal, and the signal separating device outputs the high-frequency signals given to the second terminal, from the third terminal. The signal separating device can separate the transmission high-frequency signals given to the transmission-reception antenna and the high-frequency signals received by the transmission-reception antenna. The high-frequency signals outputted from the third terminal are given to the mixer, and at the same time, the high-frequency signals outputted from the other output portion of the selecting device are given to the mixer as local signals, whereby the mixer mixes the high-frequency signals received by the transmission-reception antenna and the high-frequency signals oscillated from the high-frequency oscillator, and outputs intermediate frequency signals. In the high-frequency transmission-reception apparatus, oscillation characteristics can be tuned so as to be optimal in the state where the high-frequency oscillator is integrated into the high-frequency transmission-reception apparatus, and moreover, an operation is conducted so that the optimal oscillation characteristics are maintained, with the result that a high-frequency transmission-reception apparatus that can stably exhibit a good transmission-reception performance is realized. Moreover, since oscillation characteristics are optimally regulated, it is possible to widen a margin until good transmission-reception characteristics cannot be obtained because of a change of environmental conditions such as temperature and humidity and a change of oscillation characteristics, with the result that a high-frequency transmission-reception apparatus that can exhibit a stable transmission-reception performance in spite of a change of environmental conditions is realized.

The invention provides a high-frequency transmission-reception apparatus comprising:

the high-frequency oscillator described above:

a selecting device having two output portions, connected to the high-frequency oscillator, for selectively outputting high-frequency signals given by the high-frequency oscillator from one or both of the output portions;

a transmission antenna connected to the one output portion;

a reception antenna; and a mixer connected to the other output portion and the reception antenna, for mixing high-frequency signals outputted from the other output portion and high-frequency signals received by the reception antenna and outputting intermediate frequency signals.

According to the invention, high-frequency signals oscillated from the high-frequency oscillator are given to the selecting device. The selecting device selectively outputs the high-frequency signals given by the high-frequency oscillator from the one output portion and the other output portion, and the high-frequency signals outputted from the one output portion are given to the transmission antenna as transmission high-frequency signals, and radiated as radio waves from the transmission antenna. High-frequency signals received by the reception antenna are given to the mixer, and at the same time, the high-frequency signals outputted from the other output portion of the selecting device are given to the mixer as local signals, whereby the mixer mixes the high-frequency signals received by the reception antenna and the high-frequency signals oscillated from the high-frequency oscillator, and outputs intermediate frequency signals. Also in the high-frequency transmission-reception apparatus using antennas separated for transmission and reception, oscillation characteristics can be tuned so as to be optimal in the state where the high-frequency oscillator is integrated into the high-frequency transmission-reception apparatus, and moreover, an operation is conducted so that the optimal oscillation characteristics are maintained, with the result that a high-frequency transmission-reception apparatus that can stably exhibit a good transmission-reception performance is realized. Moreover, since oscillation characteristics are regulated optimally, it is possible to widen a margin until good transmission-reception characteristics cannot be obtained because of a change of environmental conditions such as temperature and humidity and a change of oscillation characteristics, with the result that a high-frequency transmission-reception apparatus that can exhibit a stable transmission-reception performance in spite of a change of the environmental conditions is realized.

The invention provides a high-frequency transmission-reception apparatus comprising:

the high-frequency oscillator described above;

a branching device having two output portions, connected to the high-frequency oscillator, for branching high-frequency signals given by the high-frequency oscillator and outputting branched high-frequency signals from one or both of the output portions;

a signal separating device having a first terminal, a second terminal and a third terminal, for receiving at the first terminal the transmission high-frequency signals from the one output portion of the branching device, for outputting from the second terminal the transmission high-frequency signals inputted from the first terminal, and for outputting from the third terminal the high-frequency signals inputted from the second terminal;

a transmission-reception antenna connected to the second terminal; and a mixer connected to the other output portion and the third terminal, for mixing branched high-frequency signals outputted from the other output portion and high-frequency signals received by the transmission-reception antenna and outputting intermediate frequency signals.

According to the invention, high-frequency signals oscillated from the high-frequency oscillator of the invention are given to the branching device and branched by the branching device, and the branched high-frequency signals are outputted from the one or both of the output portions of the branching device. The high-frequency signals outputted from the one output portion are given to the first terminal of the signal separating device as transmission high-frequency signals. The signal separating device outputs the transmission high-frequency signals given to the first terminal, from the second terminal, and the transmission high-frequency signals are radiated as radio waves from the transmission-reception antenna connected to the second terminal. High-frequency signals received by the transmission-reception antenna are given to the second terminal, and the signal separating device outputs the high-frequency signals given to the second terminal, from the third terminal. The signal separating device can separate the transmission high-frequency signals given to the transmission-reception antenna and the high-frequency signals received by the transmission-reception antenna. The high-frequency signals outputted from the third terminal are given to the mixer, and at the same time, high-frequency signals are given from the branching device to the mixer, whereby the mixer mixes the high-frequency signals received by the transmission-reception antenna and the high-frequency signals oscillated from the high-frequency oscillator but not modulated by the modulator, and outputs intermediate frequency signals. In the high-frequency transmission-reception apparatus, oscillation characteristics can be tuned so as to be optimal in the state where the high-frequency oscillator is integrated into the high-frequency transmission-reception apparatus, and moreover, an operation is conducted so that the optimal oscillation characteristics are maintained, with the result that a high-frequency transmission-reception apparatus that can stably exhibit a good transmission-reception performance is realized. Moreover, since oscillation characteristics are optimally regulated, it is possible to widen a margin until good transmission-reception characteristics cannot be obtained because of a change of environmental conditions such as temperature and humidity and a change of oscillation characteristics, with the result that that a high-frequency transmission-reception apparatus that can exhibit a stable transmission-reception performance in spite of a change of environmental conditions is realized.

The invention provides a high-frequency transmission-reception apparatus comprising:

the high-frequency oscillator described above;

a branching device connected to the high-frequency oscillator, for branching high-frequency signals given by the high-frequency oscillator and outputting the high-frequency signals from one or both of the output portions;

a transmission antenna connected to the one output portion;

a reception antenna; and a mixer connected to the other output portion and the reception antenna, for mixing branched high-frequency signals outputted from the other output portion and high-frequency signals received by the reception antenna and outputting intermediate frequency signals.

According to the invention, high-frequency signals oscillated from the high-frequency oscillator are given to the branching device and branched by the branching device, and the branched high-frequency signals are outputted from the one or both of the output portions of the branching device. The high-frequency signals outputted from the one output portion are given to the transmission antenna, and the transmission high-frequency signals are radiated as radio waves from the transmission antenna connected to the one output portion. High-frequency signals received by the reception antenna are given to the mixer, and at the same time, high-frequency signals are given from the branching device to the mixer, whereby the mixer mixes the high-frequency signals received by the reception antenna and the high-frequency signals oscillated from the high-frequency oscillator but not modulated by the modulator, and outputs intermediate frequency signals. In the high-frequency transmission-reception apparatus using antennas separated for transmission and reception, oscillation characteristics can be tuned so as to be optimal in the state where the high-frequency oscillator is integrated into the high-frequency transmission-reception apparatus, and moreover, an operation is conducted so that the optimal oscillation characteristics are maintained, with the result that a high-frequency transmission-reception apparatus that can stably exhibit a good transmission-reception performance is realized. Moreover, since oscillation characteristics are regulated optimally, it is possible to widen a margin until good transmission-reception characteristics cannot be obtained because of a change of environmental conditions such as temperature, and humidity and a change of oscillation characteristics, with the result that a high-frequency transmission-reception apparatus that can exhibit a stable transmission-reception performance in spite of a change of the environmental conditions is realized.

The invention provides a radar apparatus comprising:

one of the high-frequency transmission-reception apparatuses described above; and a distance information detector that processes the intermediate frequency signals outputted from the high-frequency transmission-reception apparatus and detects information on the distance to a detection object.

According to the invention, the radar apparatus comprises one of the high-frequency transmission-reception apparatuses described above, and a distance information detector that processes the intermediate frequency signals outputted from the high-frequency transmission-reception apparatus and detects information on the distance to a detection object. Therefore, the transmission-reception performance of the high-frequency transmission-reception apparatus is good and stable, with the result that a radar apparatus that can speedily and securely detect a detection object and can securely detect even detection objects at close range and in the distance is realized.

The invention provides a radar-apparatus-equipped vehicle comprising the radar apparatus described above, the radar apparatus being used for detection of a detection object.

According to the invention, the radar-apparatus-equipped vehicle comprises the radar apparatus described above, and the radar apparatus is used for detection of a detection object. Therefore, the radar apparatus can speedily and securely detect another vehicle, an obstacle and the like as detection objects, with the result that a radar-apparatus-equipped vehicle that can properly control the vehicle and give a proper warning to the driver, for example, without causing the vehicle to abruptly act so as to avoid the detection objects is realized.

The invention provides a radar-apparatus-equipped small boat comprising the radar apparatus described above, the radar apparatus being used for detection of a detection object.

According to the invention, the radar-apparatus-equipped small boat comprises the radar apparatus mentioned above, and the radar apparatus is used for detection of a detection object. Therefore, the radar apparatus can speedily and securely detect another small boat, an obstacle and the like as detection objects, with the result that a radar-apparatus-equipped small boat that can properly control the small boat and give a proper warning to the operator, for example, without causing the small boat to abruptly act so as to avoid the detection objects is realized.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
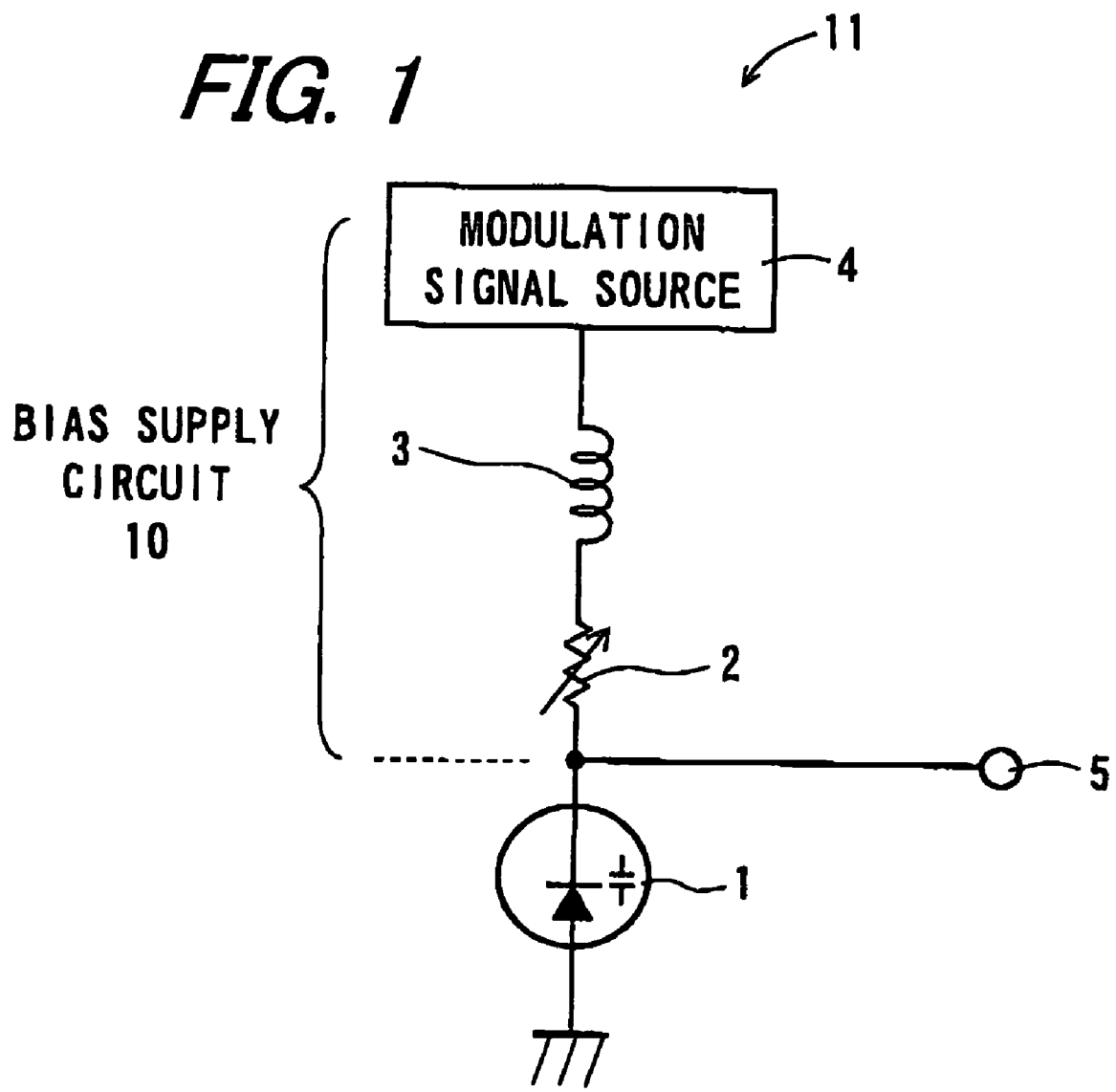
FIG. 1 is a schematic block circuit diagram showing a variable-capacitance element and a bias supply circuit in a high-frequency oscillator 11 of an embodiment of the invention.

Now referring to the drawings, preferred embodiments of the invention are described below.

Preferred embodiments of the invention transmission-reception apparatus will be described in detail hereinafter referring to the drawings.

Figure 2:
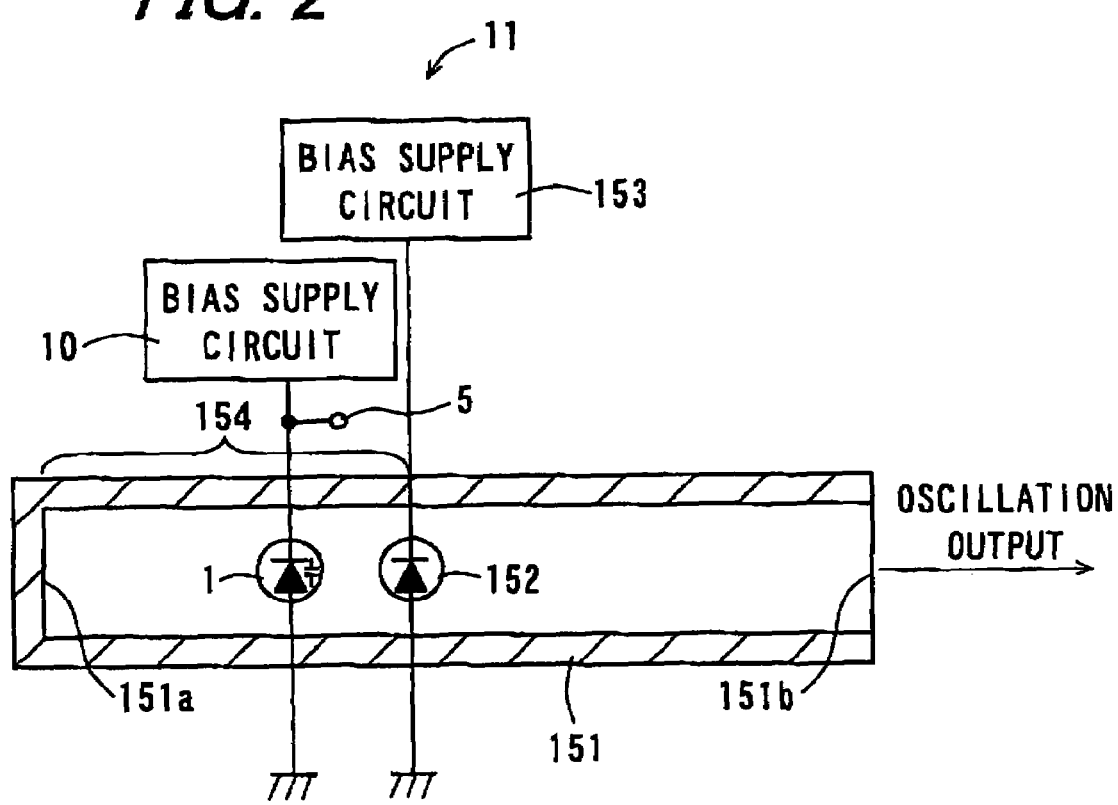
FIG. 2 is a schematic cross section view showing an example of the high-frequency oscillator 11.
Figure 3A:
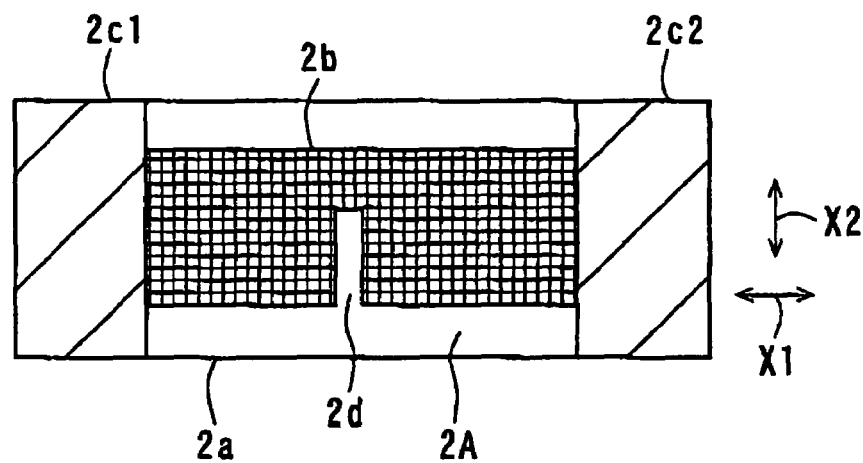
FIGS. 3A and 3B are a plan view and a side view schematically showing a trimmable chip resistor as a component of the bias supply circuit shown FIG. 1 and an example of a trimming method thereof.
Figure 3B:
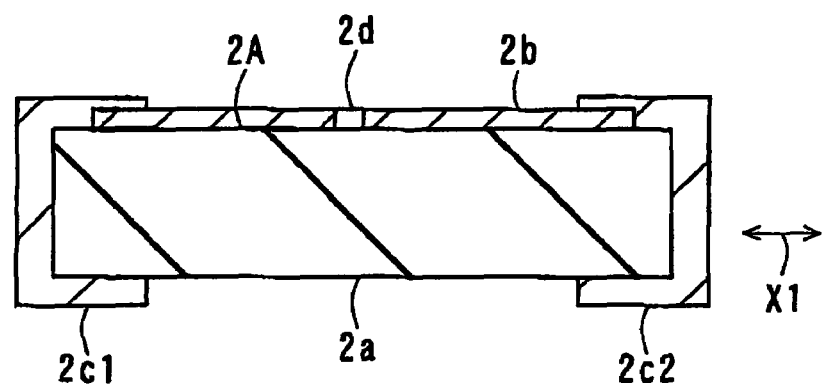
Figure 5:
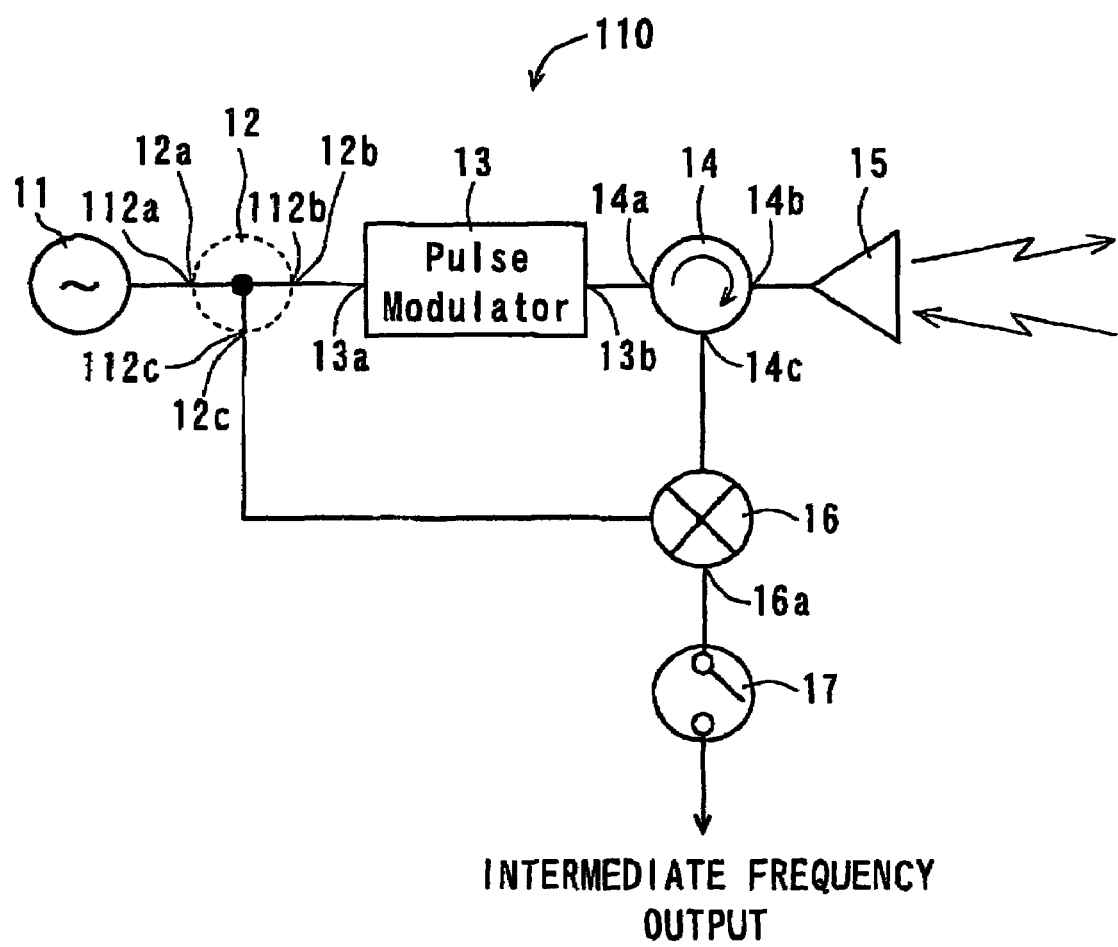
FIG. 5 is a schematic block circuit diagrams showing a high-frequency transmission-reception apparatus 110 of a first embodiment of the invention.
Figure 6:
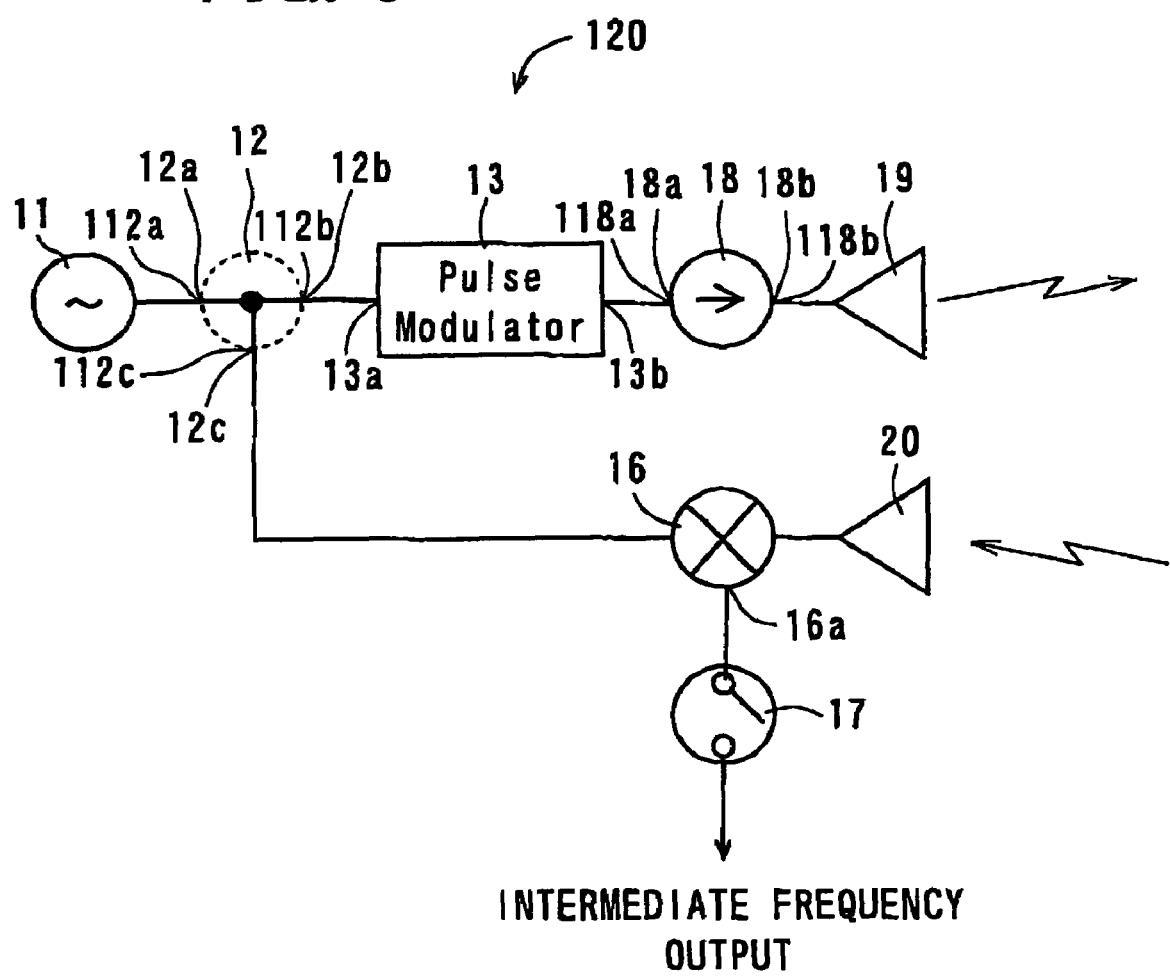
FIG. 6 is a schematic block circuit diagrams showing a high-frequency transmission-reception apparatus 120 of a second embodiment of the invention.
Figure 7:
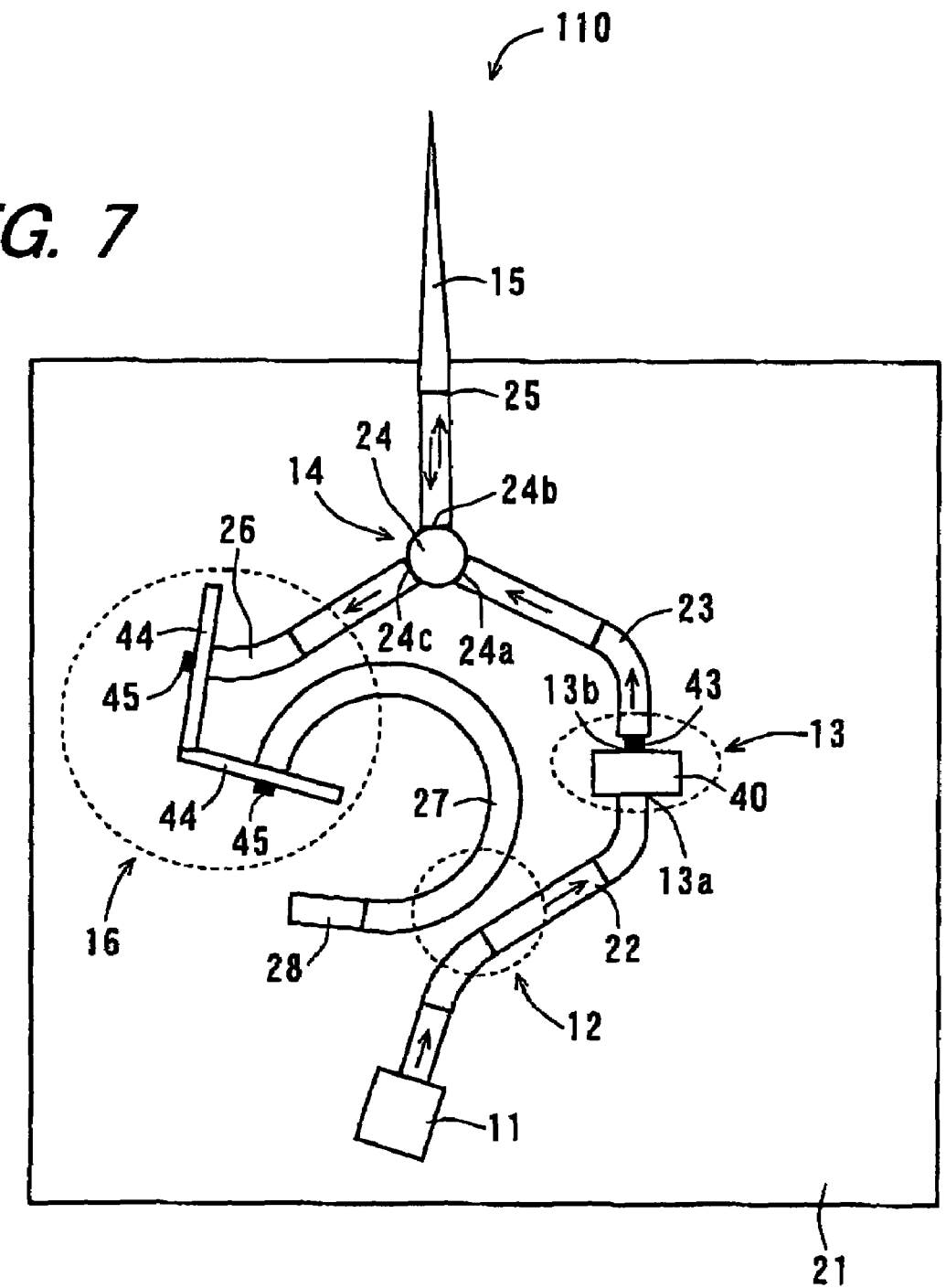
FIG. 7 is a schematic plan view of the high-frequency transmission-reception apparatus shown in FIG. 5.
Figure 8:
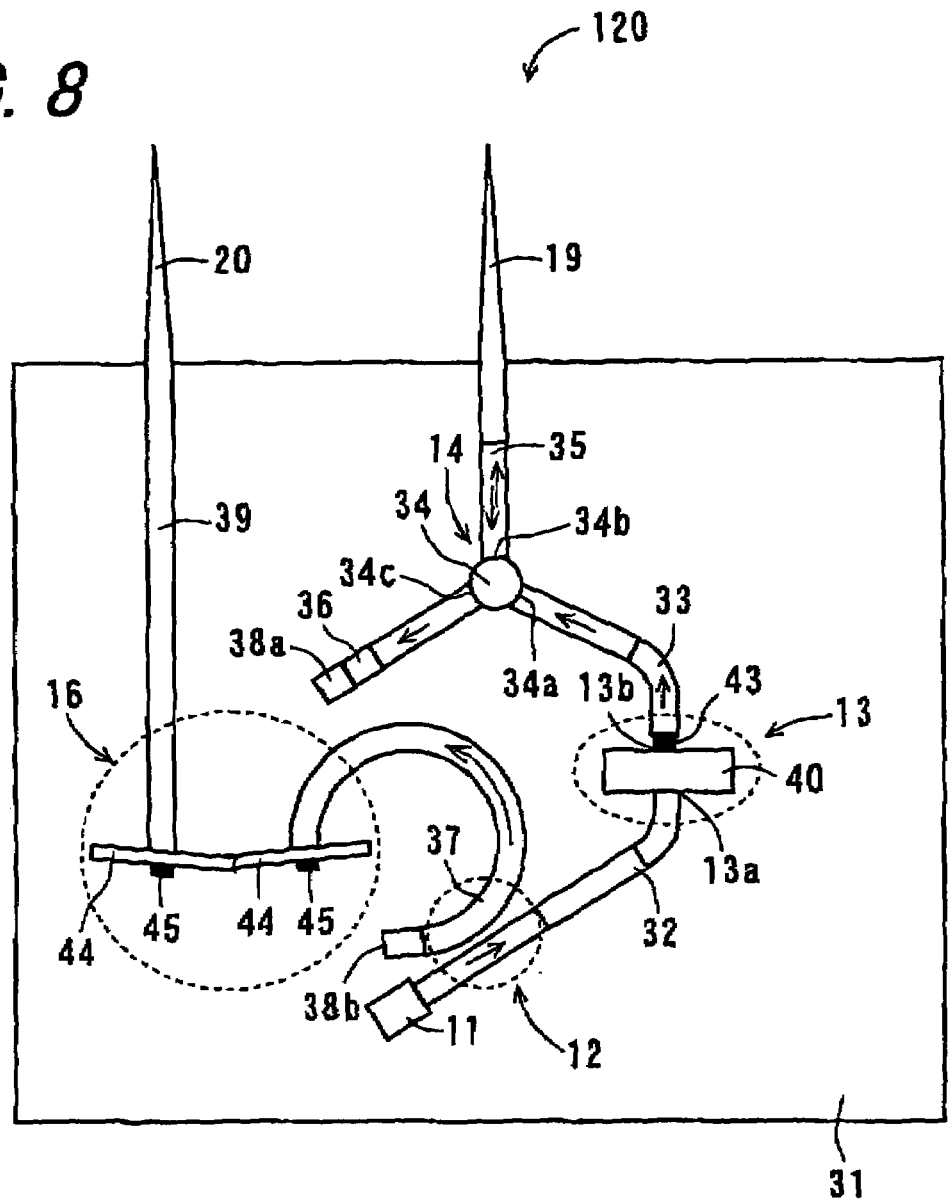
FIG. 8 is a schematic plan view of the high-frequency transmission-reception apparatus shown in FIG. 6.
Figure 9:
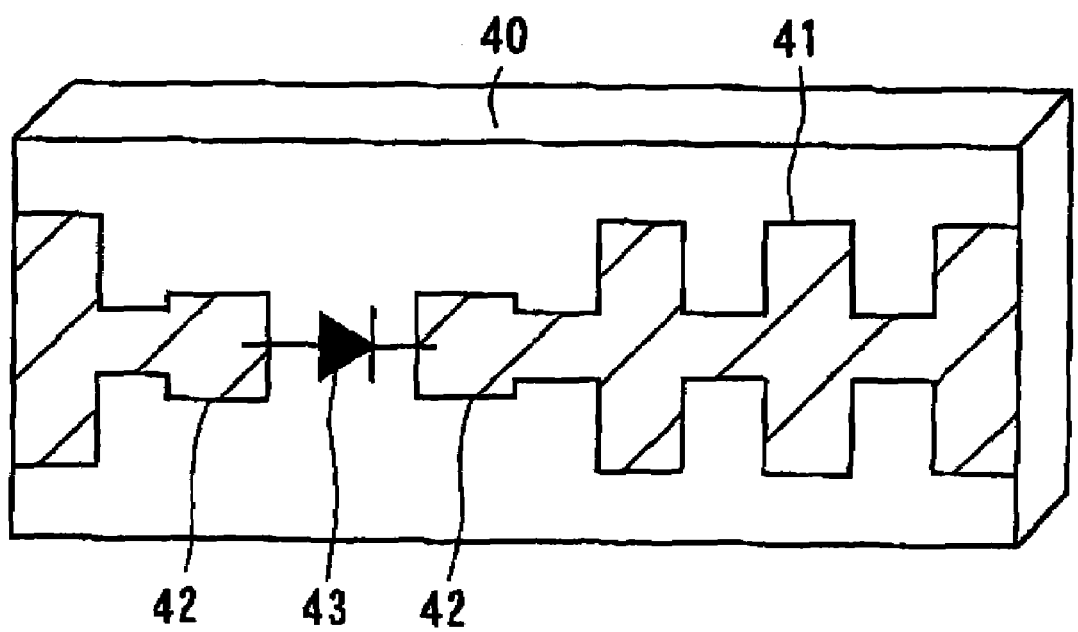
FIG. 9 is a schematic perspective view showing an example of a high-frequency modulating portion in a modulator of each of the high-frequency transmission-reception apparatuses shown in FIGS. 5 to 8.
Figure 10:
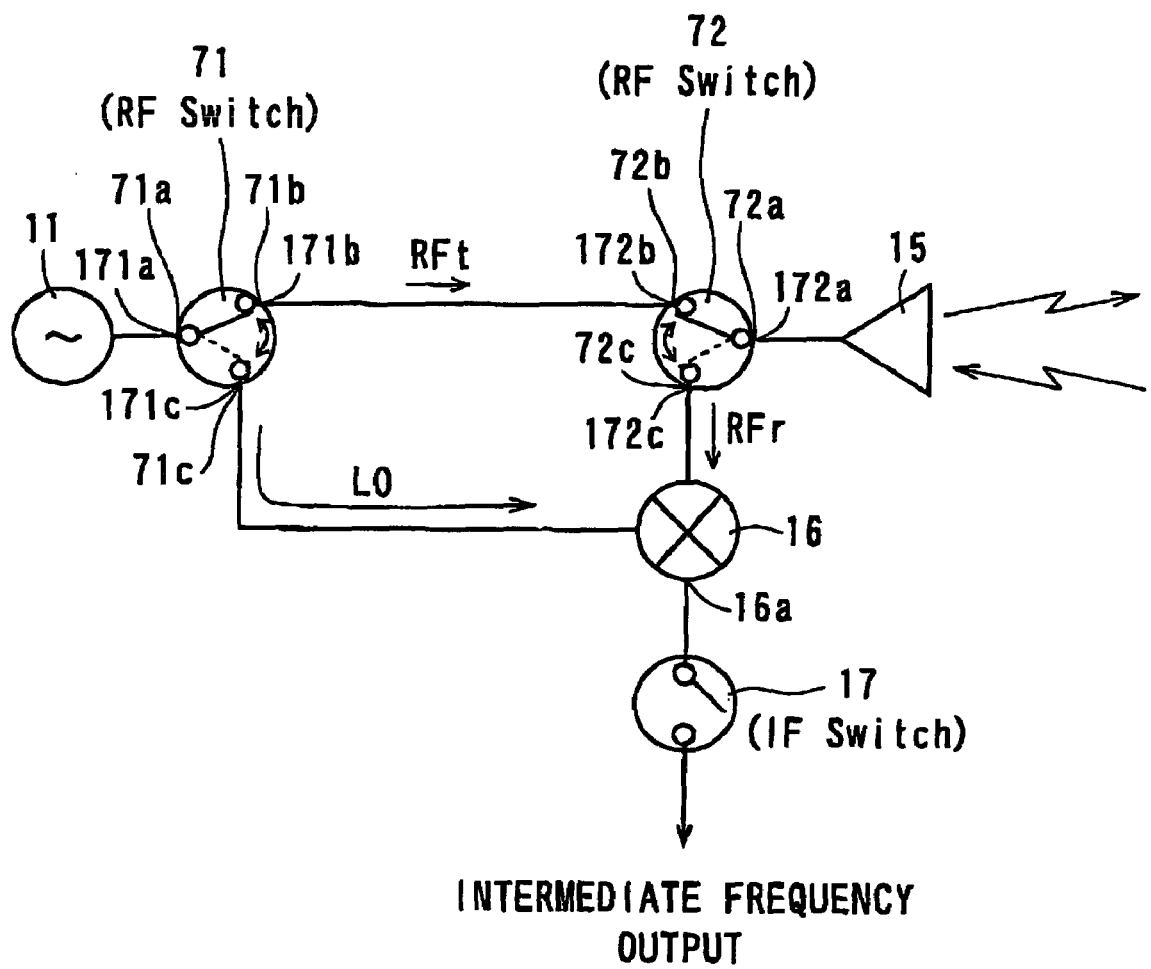
FIG. 10 is a schematic block circuit diagram showing a high-frequency transmission-reception apparatus 130 of a third embodiment of the invention.
Figure 11:
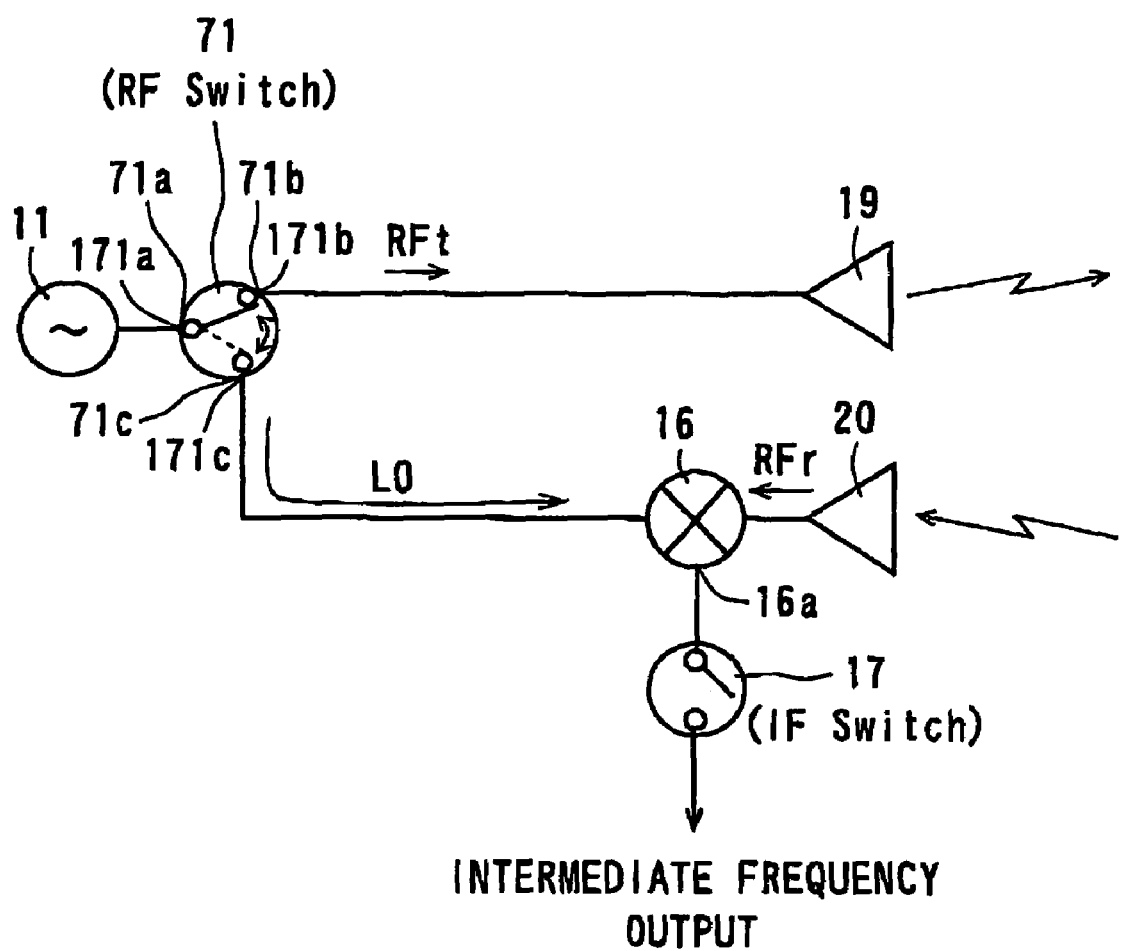
FIG. 11 is a schematic block circuit diagram showing a high-frequency transmission-reception apparatus 140 of a fourth embodiment of the invention.
Figure 12:
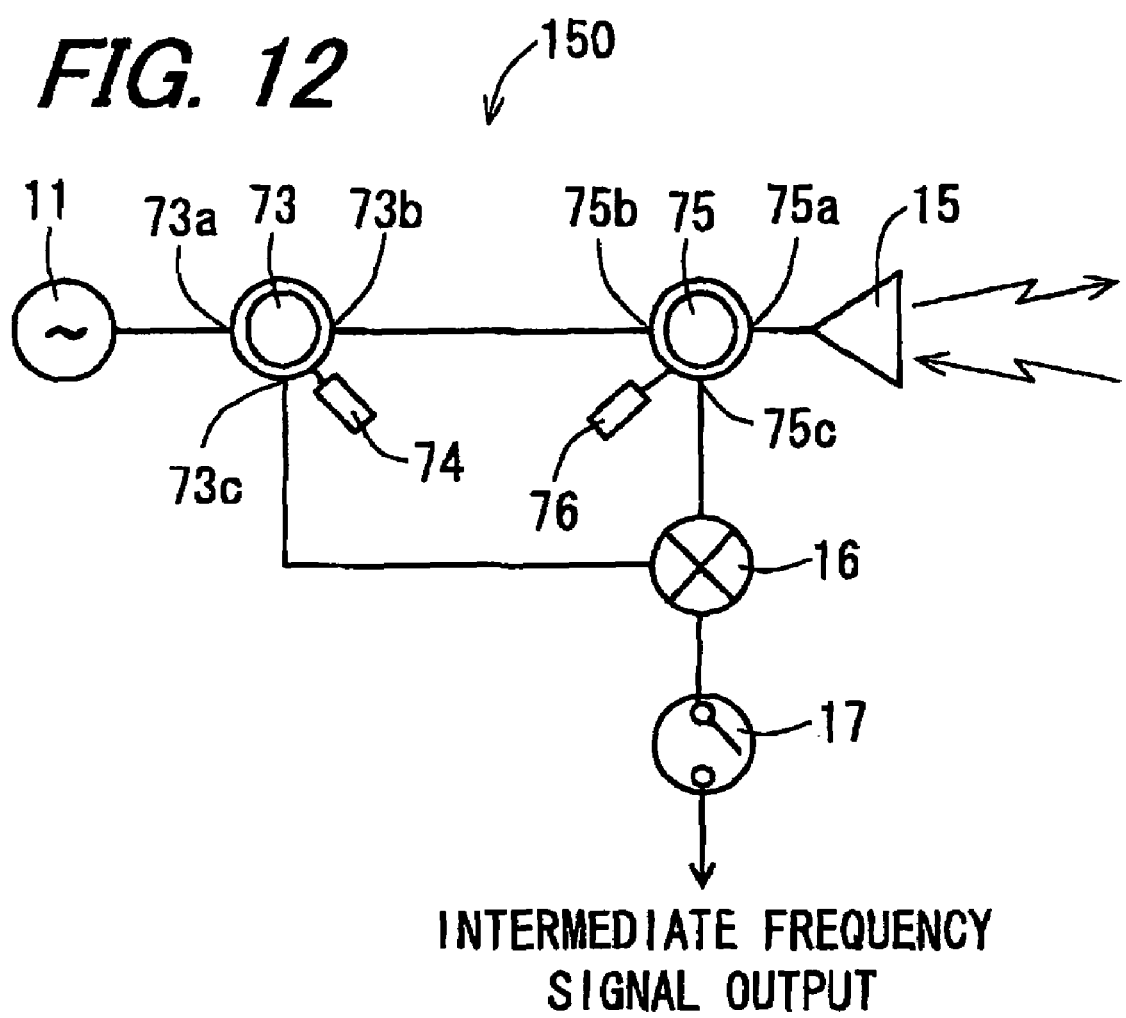
FIG. 12 is a schematic block circuit diagram showing a high-frequency transmission-reception apparatus 150 of a fifth embodiment of the invention.
Figure 13:
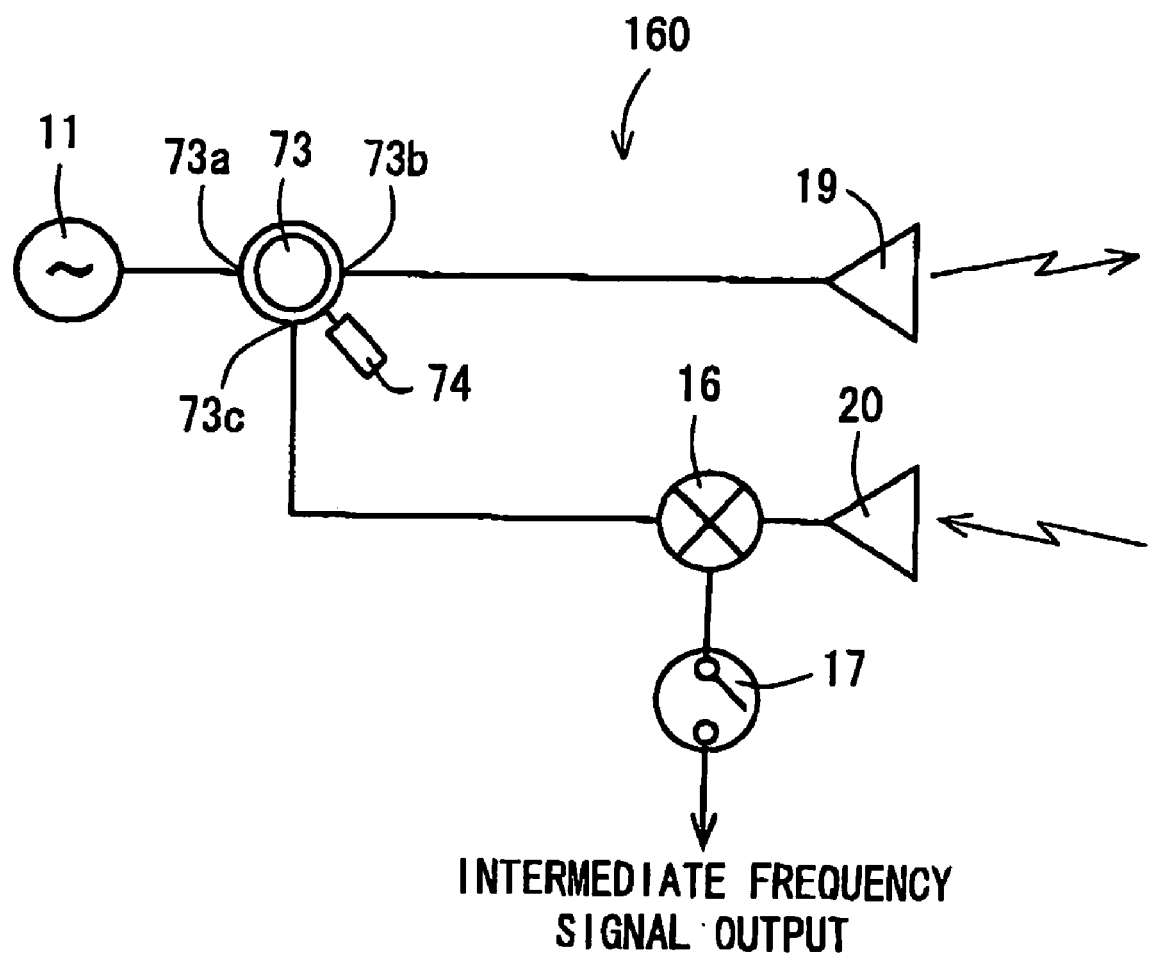
FIG. 13 is a schematic block circuit diagram showing a high-frequency transmission-reception apparatus 160 of a sixth embodiment of the invention.
Figure 14:
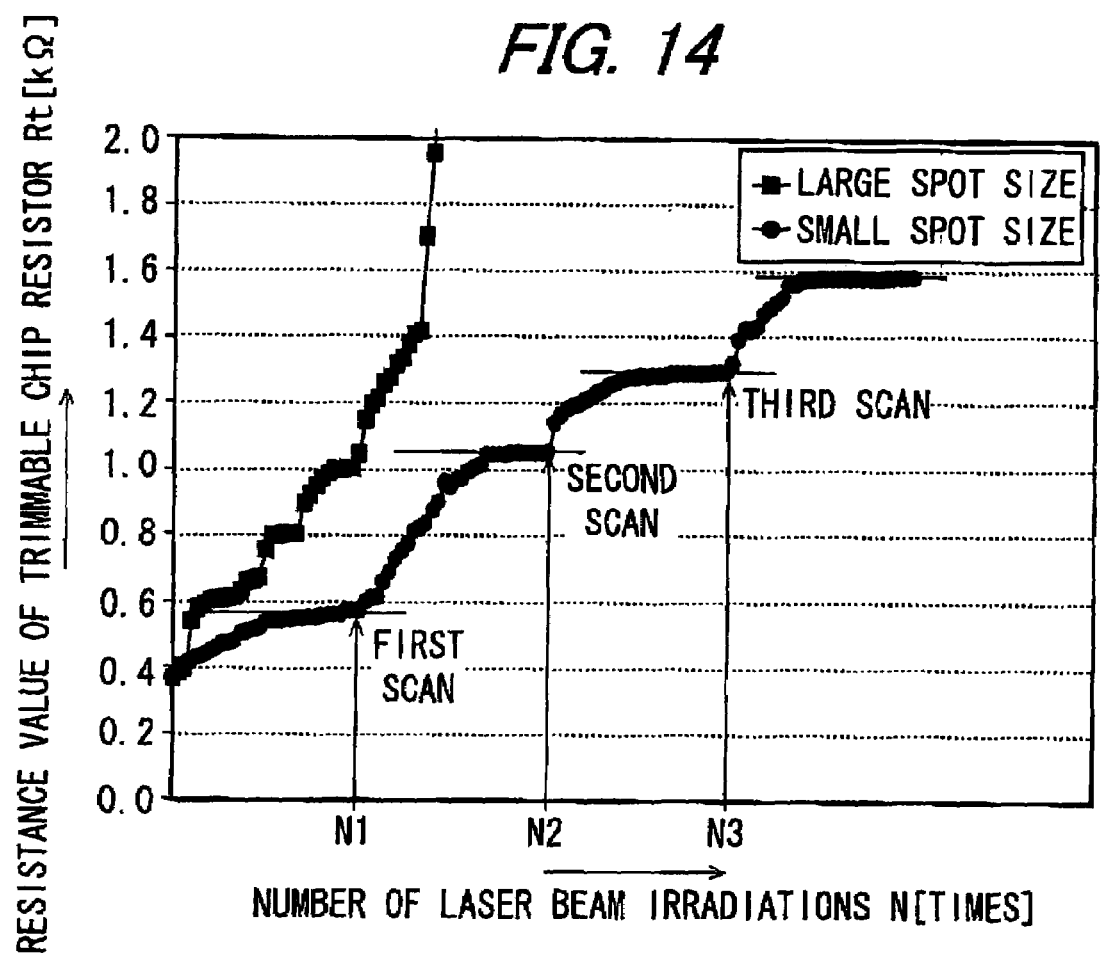
FIG. 14 is a diagram showing the relation between a number of times of trimming processes to the trimmable chip resistor and a resistance value thereof in an example of a high-frequency oscillator 11 of the invention.
Figure 15:
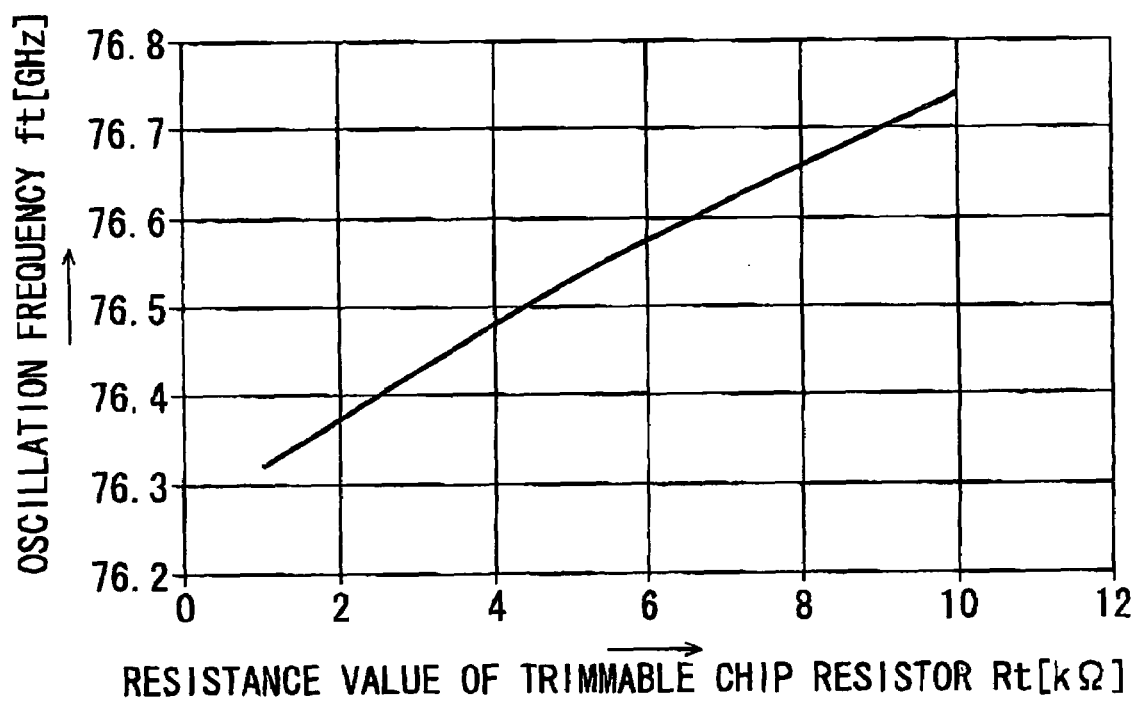
FIG. 15 is a diagram showing the relation between a resistance value of the trimmable chip resistor and an oscillation frequency in an example of the high-frequency oscillator 11 of the invention.

FIG. 1 is a schematic block circuit diagram showing a variable-capacitance element 1 and a bias supply circuit 10 in a high-frequency oscillator 11 of an embodiment of the invention. FIG. 2 is a schematic cross section view showing the high-frequency oscillator 11. FIGS. 3A and 3B are a plan view and a side view schematically showing a trimmable chip resistor 2 as a component of the bias supply circuit 10 shown in FIG. 1 and an example of a trimming method thereof, respectively. FIGS. 4A to 4E are schematic plan views showing other examples of the trimming method of the trimmable chip resistor 2 shown in FIG. 3, respectively. In FIGS. 3A, 4A to 4E, in order to facilitate the illustration, a resistor layer 2b is hatched, and the electrodes 2c1, 2c2 are shaded. FIGS. 5 and 6 are schematic block circuit diagrams showing high-frequency transmission-reception apparatuses 110, 120 of first and second embodiments of the invention, respectively. FIGS. 7 and 8 are schematic plan views of the high-frequency transmission-reception apparatuses 110, 120 shown by the block circuit diagrams in FIGS. 5 and 6, respectively. FIG. 9 is a schematic perspective view showing an example of a high-frequency modulating portion in a modulator of each of the high-frequency transmission-reception apparatuses 110, 120 shown in FIGS. 5 to 8. FIG. 10 is a schematic block circuit diagram showing a high-frequency transmission-reception apparatus 130 of a third embodiment of the invention. FIG. 11 is a schematic block circuit diagram showing a high-frequency transmission-reception apparatus 140 of a fourth embodiment of the invention. FIG. 12 is a schematic block circuit diagram showing a high-frequency transmission-reception apparatus 150 of a fifth embodiment of the invention. FIG. 13 is a schematic block circuit diagram showing a high-frequency transmission-reception apparatus 160 of a sixth embodiment of the invention. FIG. 14 is a diagram showing the relation between a number of times of trimming processes to the trimmable chip resistor and a resistance value thereof in an embodiment of a high-frequency oscillator 11 of the invention. FIG. 15 is a diagram showing the relation between a resistance value of the trimmable chip resistor and an oscillation frequency in an example of the high-frequency oscillator 11 of the invention.

In FIGS. 1 to 4, reference numeral 1 denotes a varactor diode serving as a variable-capacitance element, reference numeral 2 denotes a trimmable chip resistor serving as a pre-set variable resistor, reference numeral 3 denotes a choke inductor, reference numeral 4 denotes a modulation signal source, reference numeral 5 denotes a test terminal, reference numeral 2a denotes a dielectric base of the trimmable chip resistor 2, reference numeral 2b denotes a resistor layer of the trimmable chip resistor 2, reference numerals 2c1, 2c2 denote electrodes of the trimmable chip resistor 2, and reference numerals 2d, 2d1 to 2d4 denote trimming portions of the resistor layer 2b. Reference numeral 151 denotes a waveguide tube, reference numeral 152 denotes a Gunn diode serving as a high-frequency oscillation element, reference numeral 10 denotes a bias supply circuit, reference numeral 153 denotes a second bias supply circuit, reference numeral 154 denotes a resonator, reference numeral 155 denotes a varactor diode serving as a variable-capacitance element, reference numeral 151a denotes a short-circuit end, and reference numeral 151b denotes an output end.

In FIGS. 5 to 13, reference numeral 11 denotes a high-frequency oscillator, reference numeral 12 denotes a branching device; for example, directional coupler, reference numeral 13 denotes a modulator, reference numeral 14 denotes a circulator, reference numeral 15 denotes a transmission-reception antenna, reference numeral 16 denotes a mixer, reference numeral 17 denotes a switch, reference numeral 18 denotes an isolator, reference numeral 19 denotes a transmission antenna, reference numeral 20 denotes a reception antenna, reference numerals 21, 31 denote lower-side flat plate conductors, reference numerals 22, 32 denote first dielectric lines, reference numerals 23, 33 denote second dielectric lines, reference numerals 24, 34 denote ferrite plates serving as magnetic substances, reference numerals 25, 35 denote third dielectric lines, reference numerals 26, 36 denote fourth dielectric lines, reference numerals 27, 37 denote fifth dielectric lines, reference numerals 28, 38a, 38b denote non-reflective terminators, reference numeral 39 denotes a sixth dielectric line, reference numerals 40, 44 denote boards, reference numeral 41 denotes a choke-type bias supply line, reference numeral 42 denotes a terminal, reference numeral 43 denotes a high-frequency modulation element, reference numeral 45 denotes a high-frequency wave-detection element, reference numeral 12$a$ denotes an input end, reference numeral 12$b$ denotes one output end, reference numeral 12$c$ denotes the other output end, reference numerals 13$a$, 18$a$ denote input ends, reference numerals 13$b$, 18$b$ denote output ends, reference numerals 14$a$, 24$a$, 34$a$ denote first terminals, reference numerals 14$b$, 24$b$, 34$b$ denote second terminals, and reference numerals 14$c$, 24$c$, 34$c$ denote third terminals. Moreover, reference numeral 71 denotes a selecting RF switch serving as a selecting switch, reference numeral 72 denotes a second selecting RF switch serving as a signal separating device, reference numeral 73, 74 denote a rat-race hybric coupler, a termination resistor, respectively serving as a branching device, and reference numeral 75, 76 denote a second rat-race hybric coupler, a termination resistor, respectively, serving as a signal separating device. In FIGS. 7 and 8, upper-side flat plate conductors 21, 31 are not illustrated.

Figure 16:
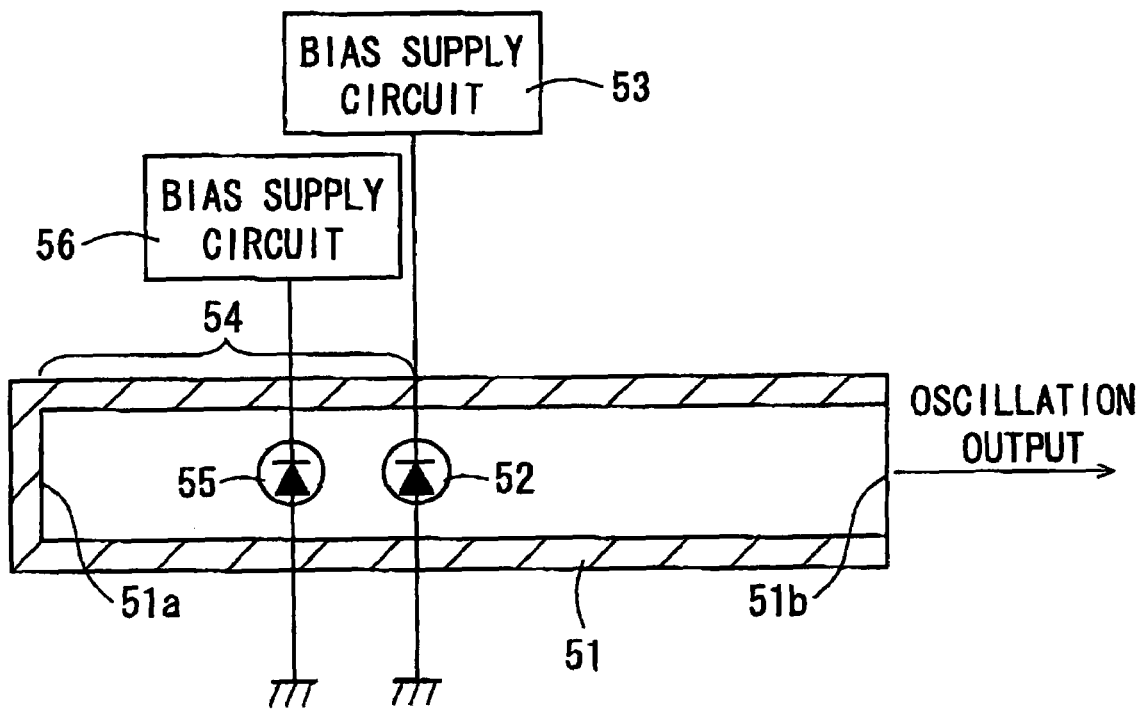
FIG. 16 is a schematic cross section view showing an example of a high-frequency oscillator.
Figure 17:
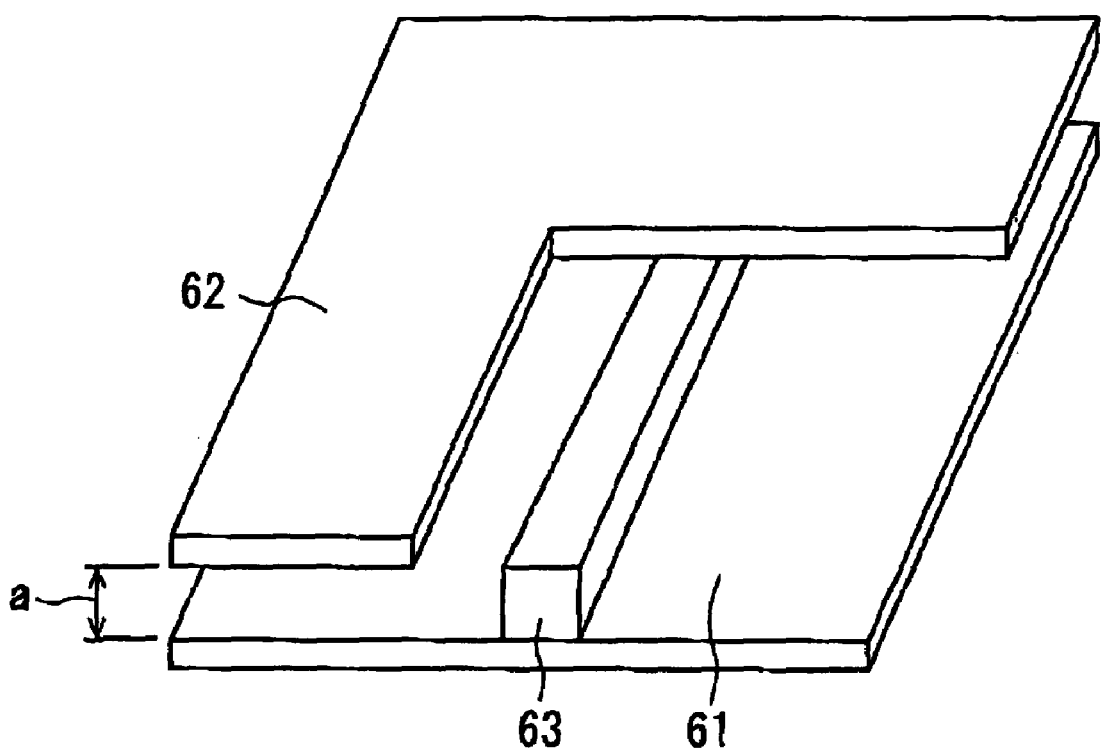
FIG. 17 is a partially cutaway perspective view showing the basic configuration of a nonradiative dielectric waveguide.

In FIG. 16, reference numeral 51 denotes a waveguide tube, reference numeral 52 denotes a Gunn diode serving as a high-frequency oscillation element, reference numerals 53, 56 denote bias supply circuits, reference numeral 54 denotes a resonator, reference numeral 55 denotes a varactor diode serving as a variable-capacitance element, reference numeral 51$a$ denotes a short-circuit end, and reference numeral 51$b$ denotes an output end. In FIG. 17, reference numerals 61, 62 denote flat plate conductors, and reference numeral 63 denotes a dielectric line.

The high-frequency oscillator of an embodiment of the invention, as shown in FIGS. 1 and 2, comprises a Gunn diode 152 serving as a high-frequency oscillation element that generates high-frequency signals, a resonator 154 connected to the Gunn diode 152, a varactor diode 1 serving as a variable-capacitance element that is disposed on the resonator 154 and changes a resonance frequency of the resonator 154, and a first bias supply circuit 10 that is connected to the varactor diode 1 and supplies a bias voltage applied in order to change a capacitance of the varactor diode 1, and the first bias supply circuit 10 is provided with a trimmable chip resistor 2 serving as a pre-set variable resistor that regulates a bias voltage.

The Gunn diode 152 is disposed inside the tube of the waveguide tube 151. One end of the waveguide tube 151 is short-circuited as the short-circuit end 151$a$, the other end thereof is opened as the output end 151$b$, and the Gunn diode 152 is disposed on the middle portion between the short-circuit end 151$a$ and the output end 151$b$ in the waveguide tube 151. The cathode of the Gunn diode 152 is connected to the second bias supply circuit 153, and the anode thereof is grounded. When the second bias supply circuit 153 applies a bias voltage to the Gunn diode 152, thereby the Gunn diode 152 oscillates high-frequency signals. Of the waveguide tube 151, a portion between the short-circuit end 151$a$ of the waveguide tube 151 and a region where the Gunn diode 152 is disposed configures the resonator 154.

The varactor diode 1 is disposed inside the tube of the resonator 154 between the short-circuit end 151$a$ and the Gunn diode 152.

Further, the bias supply circuit 10 is provided with a choke inductor 3 and a modulation signal source 4, and the varactor diode 1, the trimmable chip resistor 2, the choke inductor 3 and the modulation signal source 4 are connected in series. The modulation signal source 4 supplies a bias voltage to the varactor diode 1 via the trimmable chip resistor 2 and the choke inductor 3. The bias voltage that the modulation signal source 4 supplies is a constant DC voltage. The anode of the varactor diode 1 is grounded, and the cathode thereof is connected to the trimmable chip resistor 2. To be more specific, the choke inductor 3 is connected to between the trimmable chip resistor 2 and the modulation signal source 4. In the present embodiment, the bias supply circuit 10 applies a positive voltage to the varactor diode 1 so as to become reverse bias, but in the case where the bias supply circuit 10 applies a negative voltage to the varactor diode 1 so as to become reverse bias, the cathode of the varactor diode 1 is grounded, and the anode thereof is connected to the trimmable chip resistor 2.

Furthermore, the bias supply circuit for the varactor diode 1 is provided with, between the varactor diode 1 and the bias supply circuit, a test terminal 5 for connecting a voltage source applying a test bias voltage in parallel to the varactor diode 1. To be more specific, the test terminal 5 is connected to the connection region of the varactor diode 1 and the trimmable chip resistor 2. By giving the test terminal 5 electric potential, it is possible to apply a voltage only to the varactor diode 1. In another embodiment of the invention, it is not necessary to always dispose the test terminal 5.

In the above configuration, as shown in FIG. 3, the trimmable chip resistor 2 is such that for example, a resistor layer 2$b$ made of a resistor substance such as a Ni—Cr (nickel-chrome) alloy is formed on a dielectric base 2$a$ made of a dielectric substance such as alumina ceramics, more specifically on one surface 2A in a thickness direction of the dielectric base 2$a$, and electrodes 2$c$1, 2$c$2 are formed so as to be connected to both end portions of the resistor layer 2$b$ and cover both end portions of the dielectric base 2$a$; and a trimming portion 2$d$ made of a metal oxide is formed by irradiating a laser beam from a YAG (yttrium, aluminum, garnet) laser or the like to the resistor layer 2$b$ of the trimmable chip resistor 2 and oxidizing part of the resistor layer 2$b$ of a proper area, whereby it is possible to change the resistance value between the electrodes 2$c$1, 2$c$2. The both end portions of the resistor layer 2$b$ are, in the resistor layer 2$b$, both end portions in a predetermined direction along the one surface 2A of the dielectric base 2$a$, and here, both end portions in a longitudinal direction X1. The both end portions of the dielectric base 2$a$ are both end portions in a predetermined direction along the one surface 2A of the dielectric base 2$a$, and here, both end portions in the longitudinal direction X1. The electrodes 2$c$1, 2$c$2 are made of a metallic material whose specific resistance is lower than that of the resistor layer 2$b$, and made by plating solder, aluminum, copper or the like. The resistor layer 2$b$ is realized by a metallic thin film having a rectangular parallelepiped shape. The resistor layer 2$b$ is formed in a region except the fringe portion on the one surface 2A in the thickness direction of the dielectric base 2$a$, and the both end portions in the longitudinal direction X1 thereof come in contact with the electrodes 2$c$1, 2$c$2, respectively.

The trimmable chip resistor 2 may have a protection film which covers the resistor layer 2$b$ between the electrodes 2$c$1, 2$c$2 and has an electrical insulation property. The protection film transmits approximately 99% of the beam of the YAG laser. By disposing the protection film, the need for performing extra treatment for protecting the resistor layer 2$b$ after trimming is eliminated, so that after-treatment becomes easy. Moreover, since the resistor layer 2$b$ is protected by the protection film, a change of the resistance value of the resistor layer 2$b$ is inhibited, and a stable resistance value is maintained in the trimmable chip resistor 2.

In the high-frequency oscillator 11, in a similar manner as in the case of using a fixed resistor such as a chip resistor in the bias supply circuit 56 of the related art, the trimmable chip resistor 2 performs a function of setting a voltage applied to the varactor diode 1 to a proper value depending on the resistance value thereof and setting a proper capacitance value in the varactor diode 1, thereby exhibiting proper oscillation characteristics such as an oscillation frequency and a frequency modulation width. However, as to the trimmable chip resistor 2, unlike a fixed resistor such as a chip resistor, even if it is already connected as a component of the high-frequency oscillator 11 in a batch reflow process or the like when the high-frequency oscillator is integrated into the high-frequency transmission-reception apparatus, it is possible to perform tuning of oscillation characteristics so as to adapt to load conditions by regulating the resistance value of the trimmable chip resistor 2 by a method such as trimming. Under normal conditions, impedance from the output end 151b of the high-frequency oscillator 11 toward a high-frequency circuit element connected to the output end 151b as a load condition may vary, and the load characteristic of the Gunn diode 152 may vary. Therefore, by tuning oscillation characteristics so as to adapt to load conditions by regulating the resistance value of the trimmable chip resistor 2, it is possible to make oscillation characteristics uniform in the mass-produced high-frequency oscillators 11, as well as it is possible to increase yields because it becomes possible to obtain desired oscillation characteristics.

It is possible to obtain the function of the trimmable chip resistor 2 as described above not only when using the trimmable chip resistor 2 but also when using a pre-set variable resistor such as a mechanical trimmer resistor of a rotation type, a contact type or the like or a potentiometer, but the trimmable chip resistor 2 is preferable in that the resistance value thereof does not change even if vibrations are applied, and in that reliability with respect to temperature and humidity is high.

In specific, the trimmable chip resistor 2 can be used in the following manner. That is to say, by irradiating, for example, a YAG laser beam, in parallel with a width direction X2 of the resistor layer 2b, from the outside of a surrounding area of the resistor layer 2b where the electrodes 2c1, 2c2 are not connected toward the inside thereof and forming a linear oxidized portion by oxidizing part of the resistor layer 2b so that the trimming portion 2d can be formed as shown in FIG. 3. An oxidized part of the resistor layer 2b is referred to as the trimming portion 2d. The resistance value of the trimmable chip resistor 2 changes depending on the area of the trimming portion 2d like a linear oxidized portion, and as the aforementioned area is increased, the area of the section of a flow path where an electric current flows in the section of the resistor layer 2b decreases, so that it is possible to make the resistance value larger. When the resistor layer 2b is oxidized, for example, all portions from one surface to the other surface in the thickness direction of the resistor layer 2b may be oxidized in a region irradiated with a laser beam, or only one surface portion in the thickness direction of the resistor layer 2b may be oxidized in a region irradiated with a laser beam.

When adjusting the resistance value of the trimmable chip resistor 2, it is usual to select one whose initial value of a resistance value is smaller in a desired regulation range and regulate the resistance value in the direction of increasing the resistance value. Moreover, when increasing the area of the trimming portion 2b by a linear oxidized portion, by setting the width of the trimming portion 2d to a certain one determined by the spot size of the YAG laser beam and causing the YAG laser beam to scan in one axial direction, the area can be increased in the scanning direction. Besides, on this occasion, a pulsed YAG laser beam can be irradiated plural times to one part before next scan. This makes it possible to perform regulation of the resistance value (trimming) with high accuracy.

In the present embodiment, the resistance value of the resistor layer 2b is changed by oxidizing part of the resistor layer 2b, but in still another embodiment of the invention, the resistance value of the resistor layer 2b may be changed by cutting off part of the resistor layer 2b with laser.

Figure 4A:
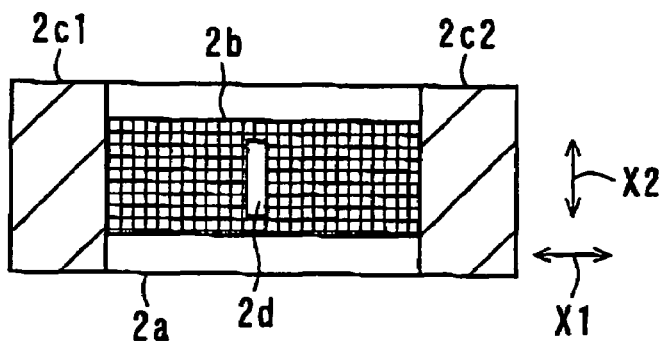
FIG. 4A to 4E are schematic plan views showing other examples of the trimming method of the trimmable chip resistor shown in FIG. 3, respectively.
Figure 4B:
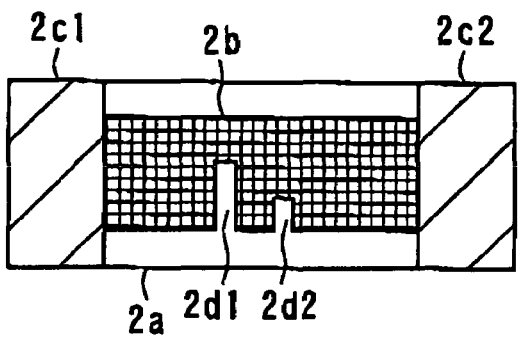

Not only the linear oxidized portion as shown in FIG. 3 but also a linear oxidized portion like the abovementioned one formed like an island in the middle of the resistor layer 2b as shown by a plan view in FIG. 4A may be the trimming portion 2d. Moreover, as shown in FIG. 4B in the same way, after formation of a linear oxidized portion like the abovementioned one as a first oxidized portion 2d1, a similar linear oxidized portion may be formed as a second oxidized portion 2d2 at a short distance from the first oxidized portion 2d1 so as to have a shorter length than the first oxidized portion 2d1 (double oxidizations). The direction in which the first oxidized portion 2d1 extends and the direction in which the second oxidized portion 2d2 extends become parallel to each other. The first oxidized portion 2d1 and the second oxidized portion 2d2 are formed so as not to be joined together, and desirably, formed so that the end of the first oxidized portion 2d1 on the side of the second oxidized portion 2d2 and the end of the second oxidized portion 2d2 on the side of the first oxidized portion 2d1 are separated from each other at a predetermined distance in a direction perpendicular to the directions in which the first oxidized portion 2d1 and the second oxidized portion 2d2 extend, and the thickness direction of the resistor layer 2b, that is, in the longitudinal direction X1 of the resistor layer 2b.

Figure 4C:
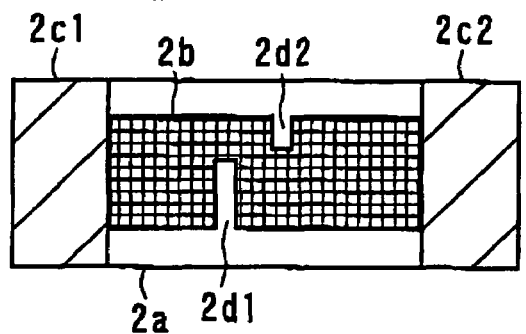

Further, as shown in FIG. 4C in the same way, in contrast to the double oxidizations described above, double oxidizations such that the second oxidized portion 2d2 is disposed on a side facing a side on which the first oxidized portion 2d1 is disposed may be formed. The direction in which the first oxidized portion 2d1 extends and the direction in which the second oxidized portion 2d2 extends are parallel to a width direction X2 of the resistor layer 2b, and the sum of the length of the first oxidized portion 2d1 in the width direction X2 and the length of the second oxidized portion 2d2 in the width direction X2 is selected so as to become shorter than the length of the resistor layer 2b in the width direction X2. By forming the trimming portion in such a manner, a line length of the resistor layer 2b can be increased, and therefore its resistance can be increased.

Figure 4D:
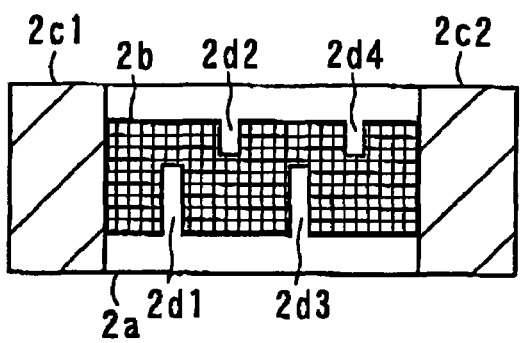

Furthermore, as shown in FIG. 4D in the same way, the double oxidized portions 2d1, 2d2 as shown in FIG. 4C and double oxidized portions 2d3, 2d4 similar thereto may be formed like the teeth of a comb (serpentine oxidizations). When the trimming portions 2d, 2d1 to 2d4 are formed as shown in FIGS. 4B to 4D, it is possible to more minutely set the resistance value by the second oxidized portions 2d2, 2d4, so that it is possible to perform regulation by more accurate trimming.

Figure 4E:
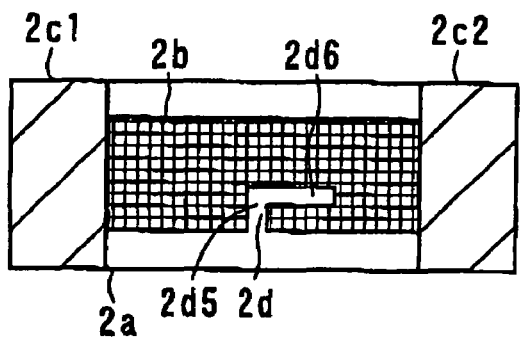

Further, as shown in FIG. 4E in a similar manner, an L-shaped oxidized portion may be disposed which has a first linear oxidized portion 2d5 formed in parallel with the width direction X2 and a second linear oxidized portion 2d6 that is formed by bending the direction of scanning the first linear oxidized portion 2d5 with a laser beam at an almost right angle in the midway and that extends in the longitudinal direction X1 of the resistor layer 2b. The length of the first linear oxidized portion 2d5 in the direction parallel to the width direction X2 of the resistor layer 2b is selected so as to become one half or less of the length of the resistor layer 2b in the width direction X2. Moreover, the length of the second linear oxidized portion 2d6 in the extending direction, that is, the length of the second linear oxidized portion 2d6 in the direction parallel to the longitudinal direction X1 of the resistor layer 2b is selected so as to be longer than the length of the first linear oxidized portion 2d5 in the direction parallel to the width direction X2 of the resistor layer 2b.

In this case, stress applied to the resistor layer 2b is relieved, and the resistor layer 2b is hard to be microcracked, so that it is possible to reduce a drift of the resistance value due to an influence by the microcrack.

Even a single trimmable chip resistor 2 makes trimming of a sufficient regulation width possible, but a plurality of trimmable chip resistors 2 connected in series or in parallel may be used.

The trimmable chip resistor 2 is disposed so as to be exposed outside when the high-frequency oscillator 11 is integrated into the high-frequency transmission-reception apparatus. Consequently, it is possible to change the resistance value of the trimmable chip resistor 2 in the state where the high-frequency oscillator 11 is integrated into the high-frequency transmission-reception apparatus.

According to one embodiment of the high-frequency oscillator 11 of the invention, because of the above configuration, the trimmable chip resistor 2 serving as a pre-set variable resistor sets a bias voltage to a proper value at the time of regulation of oscillation characteristics and operates so that the once set bias voltage value is kept at other times, for example after the high-frequency oscillator 11 is integrated into a product, with the result that it is possible to tune so that oscillation characteristics of the high-frequency oscillation element become optimum with the variable-capacitance element whose capacitance is regulated to a proper one by the bias supply circuit including the trimmable chip resistor 2, and moreover, the regulated resistance value does not change and therefore, a problem does not arise such that a bias voltage changes due to a change of the resistance value, and it is possible to stably maintain the good oscillation characteristics. Further, the trimmable chip resistor 2 does not have a movable portion, and therefore, stably keeps a set resistance value even if external forces such as vibrations are applied from outside after regulation, with the result that it is possible to stably and securely maintain good oscillation characteristics.

The pre-set variable resistor referred to in the invention is a resistor that makes it possible to variably set a resistance value and has a characteristic that a set resistance value does not vary accidentally, and in particular, as to the specification of the number of regulations of the resistance value, for example, as far as the resistor can withstand at least dozens of regulations approximately, it does not matter if the number is more.

Further, according to one embodiment of the high-frequency oscillator 11 of the invention, in the case where the test terminal 5 for connecting a voltage source applying a test bias voltage in parallel with the varactor diode 1 is disposed on between the varactor diode 1 and the bias supply circuit 10, a test bias voltage is applied to the test terminal 5, so that it is possible to accurately know in advance a bias voltage that should be applied to the varactor diode 1, and consequently, on the basis of the bias voltage, it is possible to accurately and securely set the resistance value that should be set in the trimmable chip resistor 2 without taking time for regulation. Besides, even if the pre-set variable resistor is one that cannot reversibly change the resistance value as the trimmable chip resistor 2 can, it is possible to previously obtain a resistance value that should be set in the trimmable chip resistor 2 from the value of the bias voltage that should be set, with the result that it is possible to securely set a resistance value that should be set in the trimmable chip resistor 2. In the case where a resistance value that should be set can be obtained on the basis of past data and so on without such a test, the test terminal 5 does not need to be disposed necessarily.

Under normal conditions, the capacitance value of the varactor diode 1 changes nonlinearly with respect to the voltage value of an applied bias voltage, but when it is desired to make the width of a change of a frequency in frequency modulation (a frequency modulation width) constant, the trimmable chip resistor 2 may be used so as to regulate the amplitude of a modulation signal source 2. In specific, as a resistor connected to between an inverting input terminal or a noninverting input terminal and an output terminal as a feedback circuit of an operation amplifier configuring a differential amplifier or the like that outputs modulation signals, the trimmable chip resistor 2 as described above can be used. This makes it possible to regulate a frequency modulation width as well after regulating a center frequency of frequency modulation.

In the high-frequency oscillator 11 of the invention, not only the waveguide tube 151 but also a strip line, a microstrip line, a coplanar line, a coplanar line with a ground, a slot line, a dielectric waveguide, a nonradiative dielectric waveguide and the like may be used as a high-frequency transmission line.

Next, a high-frequency transmission-reception apparatus 110 of a first embodiment of the invention shown in FIG. 5 transmission-reception apparatus comprises: the high-frequency oscillator 11 of the invention; a branching device 12 connected to the output end side of the high-frequency oscillator 11, which branches high-frequency signals and outputs to one output end 12b and the other output end 12c; a modulator 13 connected to the one output end 12b, which modulates high-frequency signals branched to the one output end 12b and outputs transmission high-frequency signals; a circulator 14 that has a first terminal 14a, a second terminal 14b and a third terminal 14c around a magnetic substance and outputs high-frequency signals inputted from one of the terminals from the next terminal adjacent thereto in this order, the output of the modulator 13 being inputted to the first terminal 14a; a transmission-reception antenna 15 connected to the second terminal 14b of the circulator 14; and a mixer 16 connected to between the other output end 12c of the branching device 12 and the third terminal 14c of the circulator 14, which mixes high-frequency signals branched to the other output end 12c and high-frequency signals received by the transmission-reception antenna 15 and outputs intermediate frequency signals.

In other words, the branching device 12 has two output portions 112b, 112c, whose input portion 112a is connected to the high-frequency oscillator 11, branches the high-frequency signals given from the high-frequency oscillator 11, and outputs from the one output portion 112b and the other output portion 112c. The modulator 13 is connected to the one output portion 112b, modulates the high-frequency signals branched to the one output portion 112b, and outputs transmission high-frequency signals. When the transmission high-frequency signals are given from the modulator 13 to the first terminal 14a, the circulator 14 serving as the signal separating device outputs the transmission high-frequency signals inputted from the first terminal 14a, from the second terminal 14b, and outputs high-frequency signals inputted from the second terminal 14b, from the third terminal 14c. The mixer 16 is connected to the other output portion 112c of the branching device 12 and the third terminal 14c, mixes the branched high-frequency signals outputted from the other output portion 112c and high-frequency signals received by the transmission-reception antenna 15, and outputs intermediate frequency signals.

Further, a high-frequency transmission-reception apparatus 120 of a second embodiment of the invention shown in FIG. 6 transmission-reception apparatus comprises: the high-frequency oscillator 11 of the invention; a branching device 12 connected to the output end side of the high-frequency oscillator 11, which branches the high-frequency signals and outputs to one output end 12b and the other output end 12c; a modulator 13 connected to the one output end 12b, which modulates high-frequency signals branched to the one output end 12b and outputs transmission high-frequency signals; an isolator 18 whose one end is connected to the output end 13b of the modulator 13, which transmits transmission high-frequency signals from the side of one end 18a to the side of the other end 1b; a transmission antenna 19 connected to the isolator 18; a reception antenna 20 connected to the side of the other output end 12c of the branching device 12; and a mixer 16 connected to between the other output end 12c of the branching device 12 and the reception antenna 20, which mixes high-frequency signals branched to the other output end 12c and high-frequency signals received by the reception antenna 20 and outputs intermediate frequency signals.

In other words, the isolator 18 has an input terminal 118a and an output terminal 118b, and when transmission high-frequency signals are given from the modulator 13 to the input terminal 118a, it outputs the transmission high-frequency signals from the output terminal 118b. The isolator 18 is an irreversible transmission device, and does not transmit signals coming from the transmission antenna 19 and given to the output terminal 118b, to the side of the input terminal 118a.

Further, a high-frequency transmission-reception apparatus 130 of a third embodiment of the invention shown in FIG. 10 comprises: the high-frequency oscillator 11 of the invention; a selecting RF switch 71 connected to the high-frequency oscillator 11, which selects high-frequency signals, and outputs to one output end 71b as transmission high-frequency signals RFt and/or the other output end 71c as local signals L0; a second selecting RF switch 72 that has an input end 72b, an output end 72c and an input-output end 72a, the input end 72b being connected to the one output end 71b, and that selects and connects the input-output end 72a to the input end 72b or the output end 72c; a transmission-reception antenna 15 connected to the input-output end 72a of the second selecting RF switch 72; and a mixer 16 that is connected to between the other output end 71c of the selecting RF switch 71 and the output end 72c of the second selecting RF switch 72, mixes the local signals L0 outputted to the other output end 71c and high-frequency signals received by the transmission-reception antenna 15, and outputs intermediate frequency signals.

In other words, the selecting RF switch 71 serving as a selecting portion has an input portion 171a and two output portions 171b, 171c, the input portion 171a being connected to the high-frequency oscillator 11, and selectively outputs high-frequency signals given by the high-frequency oscillator 11 from the one output portion 171b and/or the other output portion 171c. The second selecting RF switch 72 serving as the signal separating device has the first terminal 72b, the second terminal 72a and the third terminal 72c, receives transmission high-frequency signals from the selecting RF switch 71 at the first terminal 72b when the connection state among the first terminal 72b, the second terminal 72a and the third terminal 72c is selected, outputs high-frequency signals inputted from the first terminal 72b, from the second terminal 72a, and outputs high-frequency signals inputted from the second terminal 72a, from the third terminal 72c. The mixer 16 is connected to the other output portion 171c of the selecting RF switch 71 and the third terminal 72c of the second selecting RF switch 72.

Further, a high-frequency transmission-reception apparatus 140 of a fourth embodiment of the invention shown in FIG. 11 comprises: the high-frequency oscillator 11 of the invention; a selecting RF switch 71 connected to the high-frequency oscillator 11, which selects high-frequency signals, and outputs to one output end 71b as transmission high-frequency signals RFt and/or the other output end 71c as local signals L0; a transmission antenna 19 connected to the one output end 71b, that is, one output portion 171b; a reception antenna 20 connected to the side of the other output end 71c of the selecting RF switch 71; and a mixer 16 that is connected to between the other output end 71c of the selecting RF switch 71 and the reception antenna 20, that is, connected to the other output portion 171c and the reception antenna 20, mixes the local signals L0 outputted to the other output end 71c and high-frequency signals received by the reception antenna 20, and outputs intermediate frequency signals.

Further, a high-frequency transmission-reception apparatus 150 of the fifth embodiment of the invention shown in FIG. 12 transmission-reception apparatus comprises: the high-frequency oscillator 11 of the invention; a rat-race hybrid coupler 73 connected to the output end side of the high-frequency oscillator 11, which branches high-frequency signals and outputs to one output end 73b and the other output end 73c; a termination resistor 74 connected between the one output end 73b and the other output end 73c; a second rat-race hybrid coupler 75 having a first terminal 75b connected to the one output end 73b, a second terminal 75a and a third terminal 75c, for receiving at the first terminal 75b the transmission high-frequency signals from the one output end 73b of the rat-race hybrid coupler 73, for outputting from the second terminal 75a the transmission high-frequency signals inputted from the first terminal 75b, and for outputting from the third terminal 75c high-frequency signals inputted from the second terminal 75a; a termination resistor 76 connected between the first terminal 75b and the third terminal 75c; a transmission-reception antenna 15 connected to the second terminal 75a of the second rat-race hybrid coupler 75; and a mixer 16 connected to between the other output end 73c of the rat-race hybrid coupler 73 and the third terminal 75c of the second rat-race hybrid coupler 75, which mixes high-frequency signals branched to the other output end 73c and high-frequency signals received by the transmission-reception antenna 15 and outputs intermediate frequency signals.

Further, a high-frequency transmission-reception apparatus 160 of a sixth embodiment of the invention shown in FIG. 13 transmission-reception apparatus comprises: the high-frequency oscillator 11 of the invention; a rat-race hybrid coupler 73 connected to the output end side of the high-frequency oscillator 11, which branches high-frequency signals and outputs to one output end 73b and the other output end 73c; a termination resistor 74 connected between the one output end 73b and the other output end 73c; a transmission antenna 19 connected to the one output end 73b; a reception antenna 20 connected to the side of the other output end 73c of the rat-race hybrid coupler 73; and a mixer 16 connected to between the other output end 73c of the rat-race hybrid coupler 73 and the reception antenna 20, which mixes high-frequency signals branched to the other output end 73c and high-frequency signals received by the reception antenna 20 and outputs intermediate frequency signals.

It is preferable to dispose a switch 17 for performing opening-closing (switching) in response to a switch control signal from outside on the output end of the mixer 16 in each of the above configurations.

The high-frequency transmission-reception apparatuses 110, 120, 130, 140, 150, 160 shown in FIGS. 5, 6, 10, 11, 12 and 13, operate in a similar manner as the conventional high-frequency transmission-reception apparatus, but can stably output transmission high-frequency signals of a specified frequency and output, because even if load conditions to obtain desired oscillation characteristics vary individually, the high-frequency oscillator 11 performs a function of tuning oscillation characteristics in accordance with the individual load conditions.

Further, in the case where the switch 17 for performing opening-closing (switching) in response to a switch control signal from outside is disposed on the output end of the mixer 16, even if part of transmission high-frequency signals leaks to the third terminal 14c of the circulator 14, the third terminal 75c of the second rat-race hybrid coupler 75 or the reception antenna 20 for lack of isolation between the first terminal 14a and the third terminal 14c of the circulator 14, between the first terminal 75b and the third terminal 75c of the second rat-race hybrid coupler 75 or between the transmission antenna 19 and the reception antenna 20, it is possible to cause the switch 17 to block intermediate frequency signals with respect to the leaked high-frequency signals so as not to output the intermediate frequency signals, with the result that it is possible to facilitate discrimination of high-frequency signals that should be received on the reception side.

To be more specific, each of the high-frequency transmission-reception apparatuses 110, 120 of the invention shown in FIGS. 5, 6, respectively, uses a nonradiative dielectric waveguide as a high-frequency transmission line for connecting the respective components described above and transmitting high-frequency signals. The basic configuration of the nonradiative dielectric waveguide is similar to that shown by a partially cutaway perspective view in FIG. 17.

That is to say, the high-frequency transmission-reception apparatus 110 of the invention shown by a block circuit diagram in FIG. 5 comprises, as shown by a plan view in FIG. 7, between a flat plate conductor 21 and the other flat plate conductor (not illustrated) placed in parallel at a space of half or less of the wavelength of high-frequency signals: the high-frequency oscillator 11 of the invention to which one end of a first dielectric line 22 is connected, which frequency-modulates high-frequency signals outputted from a high-frequency diode, causes to propagate in the first dielectric line 22 and outputs; the modulator 13 connected to the other end of the first dielectric line 22, which reflects the high-frequency signals to the side of the input end 13a or transmits to the side of the output end 13b in response to a pulse signal; a second dielectric line 23 whose one end is connected to the output end 13b of the modulator 13; the circulator 14 that has a first terminal 24a, a second terminal 24b and a third terminal 24c serving as input-output terminals for high-frequency signals, respectively, on the rim of a ferrite plate 24 placed in parallel with the flat plate conductor 21 and outputs high-frequency signals inputted from one of the terminals from the next terminal adjacent thereto in this order, the first terminal 24a being connected to the other end of the second dielectric line 23; a third dielectric line 25 and a fourth dielectric line 26 placed radially on the rim of the ferrite plate 24 of the circulator 14, one ends thereof being connected to the second terminal 24b and the third terminal 24c, respectively; the transmission-reception antenna 15 connected to the other end of the third dielectric line 25; a fifth dielectric line 27 that branches part of high-frequency signals propagating in the first dielectric line 22 and causes to propagate therein, the midway thereof being proximate or joined to the midway of the first dielectric line 22, in other words, a middle portion in the extending direction of the line being proximate or joined to a middle portion in the extending direction of the first dielectric line 22; a non-reflective terminator 28 connected to one end of the fifth dielectric line 27 on the side of the high-frequency oscillator 11; and the mixer 16 connected to between the other end of the fourth dielectric line 26 and the other end of the fifth dielectric line 27, which mixes high-frequency signals inputted from the fifth dielectric line 27 and high-frequency signals received by the transmission-reception antenna 15 and inputted from the circulator 14 and outputs intermediate frequency signals. The first dielectric line 22 and the fifth dielectric line 27 configure the branching device 12 at the proximate portion or joined portion thereof.

Further, the high-frequency transmission-reception apparatus 120 of the invention shown by a block circuit diagram in FIG. 6 comprises, as shown by a plan view in FIG. 8, between a flat plate conductor 31 and the other flat plate conductor (not illustrated) placed in parallel at a space of half or less of the wavelength of high-frequency signals: the high-frequency oscillator 11 of the invention to which one end of a first dielectric line 32 is connected, which frequency-modulates high-frequency signals outputted from a high-frequency diode, causes to propagate, in the first dielectric line 32 and outputs; the modulator 13 connected to the other end of the first dielectric line 32, which reflects the high-frequency signals to the side of the input end 13a or transmits to the side of the output end 13b in response to a pulse signal; a second dielectric line 33 whose one end is connected to the output end 13b of the modulator 13; the circulator 14 that has a first terminal 34a, a second terminal 34b and a third terminal 34c serving as input-output terminals for high-frequency signals, respectively, on the rim of a ferrite plate 34 placed in parallel with the flat plate conductor 31 and outputs high-frequency signals inputted from one of the terminals from the next terminal adjacent thereto in this order, the first terminal 34a being connected to the other end of the second dielectric line 33; a third dielectric line 35 and a fourth dielectric line 36 placed radially on the rim of the ferrite plate 34 of the circulator 14, one ends thereof being connected to the second terminal 34b and the third terminal 34c, respectively; the transmission antenna 19 connected to the other end of the third dielectric line 35; a fifth dielectric line 37 that branches part of high-frequency signals propagating in the first dielectric line 32 and causes to propagate therein, the midway thereof being proximate or joined to the midway of the first dielectric line 32; a non-reflective terminator 38a connected to the other end of the fourth dielectric line 36; a non-reflective terminator 38b connected to one end of the fifth dielectric line 37 on the side of the high-frequency oscillator 11; a sixth dielectric line 39 whose one end is connected to the reception antenna 20; and the mixer 16 connected to between the other end of the fifth dielectric line 37 and the other end of the sixth dielectric line 39, which mixes high-frequency signals inputted from the fifth dielectric line 37 and high-frequency signals received by the transmission-reception antenna 20 and inputted from the sixth dielectric line 39 and outputs intermediate frequency signals. The first dielectric line 32 and the fifth dielectric line 37 configure the branching device 12 at the proximate portion or joined portion thereof.

The first terminal 24a, the second terminal 24b and the third terminal 24c in FIG. 7 correspond to the first terminal 14a, the second terminal 14b and the third terminal 14c in FIG. 5, respectively. Moreover, the first terminal 34a, the second terminal 34b and the third terminal 34c in FIG. 9 correspond to the first terminal 14a, the second terminal 14b and the third terminal 14c in FIG. 6, respectively.

In these configurations, the modulator 13 is configured in a manner that a high-frequency modulating portion in which a diode 43 serving as a high-frequency modulation element is connected to connection terminals 42 formed in a broken region in the midway of a choke-type bias supply line 41 formed on the surface of a board 40 as shown by a perspective view in FIG. 9 is inserted between the first dielectric line 22, 32 and the second dielectric line 23, 33 so that high-frequency signals outputted from the first dielectric line 22, 32 enter the diode 43. In this configuration, as the diode 43 serving as a high-frequency modulation element, a PIN diode can be used. Otherwise, a transistor or a microwave monolithic integrated circuit (MMIC) may be used instead of the diode 43. The board 40 has an electrical insulation property, and the choke-type bias supply circuit 41 has an electric conductivity.

As the modulator 13 in the high-frequency transmission-reception apparatus of the invention, a transmission-type modulator as described above is suitable. Otherwise, instead of the transmission-type modulator, a switch such as a semiconductor switch or an MEMS (micro electromechanical system) that can transmit and reflect high-frequency signals may be used.

The high-frequency oscillator of the invention is effective in not only a high-frequency transmission-reception apparatus using the modulator 13 but also a high-frequency transmission-reception apparatus that does not use the modulator 13. In this case, it is good to, in each of the first and high-frequency transmission-reception apparatuses of the invention, remove the modulator 13 and connect the end portion of the first dielectric line 22, 32 on the side of the input end 13a and the end portion of the second dielectric line 23, 33 on the side of the output end 13b.

Further, the mixer 16 is configured in a manner that a high-frequency wave-detection portion in which a diode 45 serving as a high-frequency wave-detection element is disposed on each of two boards 44 similar to that shown in FIG. 9 is connected to each of the fourth dielectric line 26 and the fifth dielectric line 27 so that high-frequency signals outputted from each of the fourth dielectric line 26 and the fifth dielectric line 27 enter each of the diodes 45, and the midway of the fourth dielectric line 26 and the midway of the fifth dielectric line 27 are proximate or joined to each other so that the fourth dielectric line 26 and the fifth dielectric line 27 are electromagnetically coupled. In the high-frequency transmission-reception apparatus 120, the high-frequency wave-detection portion is connected to each of the fifth dielectric line 37 and the sixth dielectric line 39 so that high-frequency signals outputted from each of the fifth dielectric line 37 and the sixth dielectric line 39 enter each of the diodes 45, and the midway of the fifth dielectric line 37 and the midway of the sixth dielectric line 39 are proximate or joined to each other so that the fifth dielectric line 37 and the sixth dielectric line 39 are electromagnetically coupled. In this configuration, as the diode 45 serving as a high-frequency wave-detection element, a Schottky barrier diode can be used. Otherwise, a transistor or a microwave monolithic integrated circuit (MMIC) may be used instead of the diode 45.

Furthermore, instead of the circulator 14, a duplexer, a switch, a hybrid circuit or the like may be used The hybrid circuit is, for example, a rat-race hybrid coupler, a branch line hybrid coupler or the like.

By thus configuring a high-frequency transmission-reception apparatus by the use of a nonradiative dielectric waveguide as a high-frequency transmission line, it is possible to transmit high-frequency signals with low loss within the high-frequency transmission-reception apparatus, so that it is possible to obtain a stable transmission-reception performance. Moreover, since it is possible to make the output of transmission high-frequency signals large, there is an advantage that a complicated amplification circuit is not necessary on the reception side.

In the high-frequency transmission-reception apparatuses 110, 120 of the first and second embodiment of the invention shown by a block circuit diagram and a plan view in FIGS. 5 to 8, the high-frequency oscillator 11 operates so that oscillation characteristics are tuned optimally in a state where it is integrated into the high-frequency transmission-reception apparatus and the good oscillation characteristics are kept, with the result that a high-frequency transmission-reception apparatus that can stably exhibit a good transmission-reception performance is realized. Moreover, since oscillation characteristics are regulated optimally, it is possible to widen a margin until good transmission-reception characteristics cannot be obtained because of a change of environmental conditions and a change of oscillation characteristics, with the result that a high-frequency transmission-reception apparatus that can exhibit a stable transmission-reception performance in spite of a change of environmental conditions is realized.

Next, the components of the high-frequency transmission-reception apparatuses 110, 120 of the invention will be described in detail.

In the high-frequency transmission-reception apparatuses 110, 120 of the invention, as the material of the first to sixth dielectric lines 22, 23, 25, 26, 27, 32, 33, 35, 36, 37, 39, a resin such as ethylene tetrafluoride and polystyrene and ceramics with a low relative dielectric permittivity such as cordierite ($2MgO \cdot 2Al_2O_3 \cdot 0.5SiO_2$) ceramics, alumina ($Al_2O_3$) ceramics and glass ceramics are preferable, and they are low-loss in a millimeter-waveband.

The cross section shapes in one virtual plane perpendicular to extending directions of the first to sixth dielectric lines 22, 23, 25, 26, 27, 32, 33, 35, 36, 37, 39 are basically rectangular, but may be a schematic rectangular shape such that corners of a rectangle are rounded, and various cross section shapes used for transmission of high-frequency signals can be used.

As the material of the ferrite plates 24, 34, for example, zinc nickel iron oxide ($Zn_aNi_bFe_cO_x$) is suitable for millimeter-wave signals among ferrites.

The shapes of the ferrite plates 24, 34 are normally disk-like, but otherwise, the plane shapes thereof may be an equilateral polygon, in other words, an equilateral polygon as viewed from one side in a thickness direction. In this case, assuming the number of connected dielectric lines is n (n is an integer of 3 or more), the plane shape should be an equilateral polygon with m angles (m is an integer of 3 or more and larger than n).

The non-reflective terminators 28, 38a, 38b can be formed by attaching film-like resistors or electromagnetic-wave absorbers to upper and lower end portions of side faces (surfaces not facing the inner faces of the flat plate conductors 21, 31 and the other flat plate conductors not illustrated) on both sides of end portions of the fifth dielectric line 27, the fourth and fifth dielectric lines 36, 37 to which the non-reflective terminators 28, 38a, 38b are connected. On this occasion, as the material of the resistor, a nickel chrome alloy and carbon are suitable. As the material of the electromagnetic-wave absorber, Permalloy and Sendust are suitable. By using these materials, it is possible to efficiently attenuate high-frequency signals. Otherwise, a material other than the above material, which can attenuate high-frequency signals, may be used.

As the material of the flat plate conductors 21, 31 and the other flat plate conductors not illustrated, a conductor plate of Cu, Al, Fe, Ag, Au, Pt, SUS (stainless steel), brass (Cu—Zn alloy) or the like is suitable in respects of high electric conductivity and good processability. Otherwise, a conductor layer thereof may be formed on the surface of an insulation plate made of ceramics, resin or the like.

In the invention, a frequency range used as high-frequency signals is effective for a micro waveband, a lower frequency band in addition to a millimeter waveband.

Also in the high-frequency transmission-reception apparatuses 130, 140, 150, 160 of the invention, similarly in the high-frequency transmission-reception apparatuses 110, 120 shown in FIGS. 5 to 9, a nonradiative dielectric line, a dielectric waveguide tube line, a waveguide tube, a dielectric waveguide tube, a strip line, a microstrip line, a coplanar line, a slot line or the like can be used as the high-frequency transmission line.

Further, as the selecting RF switch 71 and the second selecting RF switch 72, the abovementioned examples of the modulator 13 can be used.

Furthermore, it is preferred that the selecting RF switch 71 is provided with a branching device which branches inputted high-frequency signals and outputs to one output end and the other output end, and first and second PIN diodes connected to the one output end and the other output end, respectively, and a bias circuit which applies a forward bias voltage is connected to at least one of the first and second PIN diodes. This is because at least one of the first and second PIN diodes becomes low-impedance, so that it is possible to make impedance from the input side (the side of the high-frequency oscillator 11) of high-frequency signals low and stable at all times even when the first and second PIN diodes are switched, and therefore, without using an isolator or the like, it is possible to inhibit a load change of the high-frequency oscillator 11 and stabilize the oscillation frequency of high-frequency signals.

Next, the radar apparatus of the invention and the radar-apparatus-equipped vehicle and radar-apparatus-equipped small boat that are equipped with the radar apparatus will be described.

The radar apparatus of the invention comprises one of the high-frequency transmission-reception apparatuses of the invention, and a distance information detector that processes intermediate frequency signals outputted from the high-frequency transmission-reception apparatus and detects information on the distance to a detection object.

According to the radar apparatus of the invention, because of the above configuration, the transmission-reception performance of the high-frequency transmission-reception apparatus is good and stable, so that it is possible to provide a radar apparatus that can speedily and securely detect a detection object and can securely detect even a detection object at close range and in the distance.

Further, the radar-apparatus-equipped vehicle of the invention comprises the radar apparatus of the invention, and uses the radar apparatus for detection of a detection object.

According to the radar-apparatus-equipped vehicle of the invention, because of such a configuration, it can control the action of the vehicle on the basis of distance information detected by the radar apparatus and give a warning of detection of an obstacle on the road, another vehicle or the like to the driver with sound, light or vibrations in a similar way as a conventional radar-apparatus-equipped vehicle, and moreover, in the radar-apparatus-equipped vehicle of the invention, it is possible to properly control the vehicle and give a proper warning to the driver without causing the vehicle to abruptly act because the radar apparatus speedily and securely detect an obstacle on the road, another vehicle or the like as a detection object.

Further, since the resistance value of the aforementioned trimmable chip resistor 2 does not change even if the vehicle vibrates, and the resistance value is hard to change with respect to temperature or humidity even if the vehicle is provided with the radar apparatus outside the vehicle, it is possible to maintain set oscillation characteristics in a good state, so that it is possible to realize a stable detection operation by a stable radar apparatus.

The radar-apparatus-equipped vehicle of the invention can be used as, in specific, not only a passenger vehicle such as a steam train, an electric train and an automobile and a car for transporting freight but also a bicycle, a motorized bicycle, a ride in an amusement park, a cart in a golf course and the like.

Furthermore, the radar-apparatus-equipped small boat of the invention comprises the radar apparatus of the invention, and uses the radar apparatus for detection of a detection object.

According to the radar-apparatus-equipped small boat of the invention, because of such a configuration, the small boat operates so as to control the action of the small boat on the basis of distance information detected by the radar apparatus and give a warning of detection of an obstacle such as a rock, another vessel, another small boat or the like to the operator with sound, light or vibrations in a similar way as a conventional radar-apparatus-equipped vehicle, and moreover, in the radar-apparatus-equipped small boat of the invention, it is possible to properly control the small boat and give a proper warning to the operator without causing the small boat to abruptly act because the radar apparatus speedily and securely detect an obstacle such as a rock, another vessel, another small boat or the like as a detection object.

Further, since the resistance value of the aforementioned trimmable chip resistor 2 does not change even if the boat vibrates, and the resistance value is hard to change with respect to temperature or humidity even if the boat is provided with the radar apparatus outside the boat, it is possible to maintain set oscillation characteristics in a good state, so that it is possible to realize a stable detection operation by a stable radar apparatus.

The radar-apparatus-equipped small boat of the invention can be used, in specific, as a boat permitted to operate with a license for small boats or without a license, such as a rowboat, a dinghy, a personal watercraft, a small Bass Boat equipped with an outboard motor, an inflatable boat (rubber boat) equipped with an outboard motor, a fishing boat, a sportfishing boat, an operation boat, a houseboat, a towing boat, a sport boat, a fishing boat, a yacht, an offshore yacht and a cruiser, which are boats of less than 20 tons gross, or as a pleasure boat, which is a boat of 20 tons gross or more.

Thus, according to the invention, it is possible to provide a high-frequency oscillator in which a bias supply circuit of a variable-capacitance element as a component of the high-frequency oscillator has a pre-set variable resistor, and which can tune oscillation characteristics such as an oscillation frequency and a frequency modulation width to a desired state with the pre-set variable resistor and can stably exhibit good oscillation characteristics, and provide a high-performance high-frequency transmission-reception apparatus using the high-frequency oscillator.

Further, according to the invention, it is possible to provide a radar apparatus comprising the high-performance high-frequency transmission-reception apparatus, and a radar-apparatus-equipped vehicle and radar apparatus-equipped small boat that are equipped with the radar apparatus.

EXAMPLE

A high-frequency oscillator was configured by connecting a bias supply circuit 10 to a pill-type Gunn diode having the varactor diode 1 shown by a circuit diagram in FIG. 1 therein as shown by a circuit diagram in FIG. 1. First, as the trimmable chip resistor 2, a resistor such that the regulation range of the resistance value thereof was 1 to 10 kΩ (in this case, the initial value was 1 kΩ and the regulative maximum value was 10 kΩ) in which it was possible to obtain a desired frequency variable range was selected, a plurality of trimmable chip resistors 2 were subjected to trimming as shown in FIG. 4A, and controllability of the resistance value was checked. An example thereof is shown by a diagram in FIG. 14.

FIG. 14 is a diagram showing the relation between a number of times of trimming processes to the trimmable chip resistor 2 and a resistance value thereof in the example of the high-frequency oscillator 11 of the invention, with a number of times N (unit: times) of irradiations of a pulsed laser beam as the number of times of trimming processes as the abscissa and a resistance value Rt (unit: kΩ) between the electrodes 2c1, 2c2 of the trimmable chip resistor 2 as the ordinate. In the diagram, a black square and a black dot represent Actual values of the resistance values Rt with respect to the numbers of times N of irradiations of a laser beam when a laser beam of a relatively large spot size was applied and when a laser beam of a relatively small spot size was applied, respectively. In the present example, the resistor layer 2b of the trimmable chip resistor 2 was made of a Ni—Cr alloy. The number of irradiations of the laser beam presents the number of the pulses of the laser beam.

From the result shown in FIG. 14, it became clear that: the resistance value of the trimmable chip resistor 2 increased substantially in proportion to the number of times N of laser beam irradiations; the increase rates differed depending on the spot sizes of the applied laser beam; and it was possible to properly regulate the resistance value of the trimmable chip resistor 2 by the spot size and the number of times N of laser beam irradiations. Moreover, at the time of laser beam irradiation, the laser beam irradiation was performed by a method such that plural times of irradiations were performed in one position of the resistor layer 2b, and thereafter, the irradiation point of the laser beam was scanned to the next position, but as obviously apparent when trimming was performed by the use of the laser beam of the relatively small spot size, it became clear that the resistance value Rt tended to be saturated as the number of times N of irradiations at one irradiation point increased, and it became clear that it was possible to reproducibly and securely trim for a desired resistance value by this method.

Furthermore, the resistance value Rt gradually increased like a staircase as a result of repetition of the scans plural times, and it became clear that it was possible to minutely trim by this method. Besides, from the foregoing, it was presumed that in order to more minutely trim, the width of increase of the resistance value Rt that increased like a staircase could be narrowed by reducing the pitch of a scan and decreasing the spot size of the laser beam more.

In the present example, the laser beam is irradiated plural times to a predetermined position of the resistor layer 2b, and when the resistance value Rt becomes saturated, the irradiation position of the laser beam is changed, and the laser beam is irradiated plural times until the resistance value Rt becomes saturated. For example, in the case of small spot size, after the laser beam is irradiated N1 (N1 is a positive integer) times to a first position of the resistor layer 2b, the irradiation position is moved to a second position of the resistor layer 2b, and after the laser beam is irradiated N2–N1 (N2 is a positive integer) times to the second position, the irradiation position is again moved to a third position of the resistor layer 2b, and the laser beam is irradiated N3–N2 (N3 is a positive integer) times to the third position.

By irradiating the same position of the resistor layer 2b with the laser beam plural times, metal oxide is gradually generated by thermal energy at a portion irradiated with the laser beam. By selecting the strength of the laser beam so that it cannot oxidize the whole region in the thickness direction at the portion irradiated with the laser beam of the resistor layer 2b at one time, the resistor layer 2b is gradually oxidized from the surface irradiated with the laser beam in accordance with the number of irradiations of the laser beam. Therefore, when the laser beam is irradiated plural times to the same position of the resistor layer 2b, and the whole region in the thickness direction at the portion irradiated with the laser beam of the resistor lawyer 2b is oxidized, the resistance value Rt becomes saturated.

In the case of utilizing that the resistance value Rt becomes saturated when the laser beam is irradiated plural times in the same position, by selecting the number of irradiations of the laser beam in the same position so as to be the number of times that the resistance value Rt becomes saturated or more, it is possible to securely regulate the resistance value Rt to a constant value even when successively irradiating the laser beam at high speed. In the case of selecting the spot size of the laser beam, the strength of the laser beam and the pulse width so that a resistance value which should be obtained by the trimmable chip resistor 2 becomes a resistance value which becomes saturated when the laser beam is irradiated, a resistance value obtained by one irradiation of the laser beam does not change largely, so that it is possible to stabilize the resistance value of the trimmable chip resistor 2 that is regulated.

In this example, the area trimmed in each irradiation was controlled by changing the width of a slit transmitting the laser beam to change the spot size of the laser beam and changing the irradiation area in each irradiation, but it may be controlled by the strength of the laser beam or by an irradiation time for each irradiation.

By changing the irradiation position of the laser beam to the trimmable chip resistor 2, the number of irradiations, the spot size of the laser beam, the strength of the laser beam and the pulse width of the laser beam and measuring them in advance, it is possible to quickly regulate the resistance values of the trimmable chip resistors 2 in the mass-produced high-frequency oscillators to a resistance value that should be obtained on the basis of the result of the measurement.

Next, by using the trimmable chip resistor 2 and performing trimming as described above plural times while properly changing the strength of a laser beam, controllability of an oscillation frequency showing an obvious characteristic change among oscillation characteristics was checked. An example thereof is shown by a diagram in FIG. 15.

FIG. 15 is a diagram showing the relation between a resistance value of the trimmable chip resistor 2 and an oscillation frequency in the example of the high-frequency oscillator of the invention, with a resistance value Rt (unit: kΩ) of the trimmable chip resistor 2 as the abscissa and an oscillation frequency ft (unit: GHz) of the high-frequency oscillator as the ordinate, wherein a solid line represents actual values of the oscillation frequency ft with respect to set values of the resistance value Rt. Load conditions of the high-frequency oscillator were fixed.

From the result shown in FIG. 15, it was confirmed that it was possible to sufficiently regulate the oscillation frequency ft by the trimmable chip resistor 2, because when the set value of the resistance value Rt was changed in the range of 1 to 10 kΩ, the oscillation frequency linearly changed in proportion thereto, and it was possible to change a oscillation frequency approximately ±0.2 GHz around 76.5 GHz in this example. At the time of regulation of the oscillation frequency, the resistance value of the trimmable chip resistor 2 is gradually increased from the lowest resistance value, that is, 1 kΩ. When the resistance value of the trimmable chip resistor 2 increases, the oscillation frequency also increases, here, the oscillation frequency gradually increases from approximately 76.3 GHz. When the resistance value of the trimmable chip resistor 2 is increased from 1 kΩ to 10 kΩ, it is possible to increase the oscillation frequency from approximately 76.3 GHZ to approximately 76.7 GHz. Since the trimmable chip resistor 2 is an irreversible resistor, the oscillation frequency is regulated by changing the oscillation frequency in one direction, here, by increasing.

Next, thirty high-frequency transmission-reception apparatuses shown in FIGS. 5 and 7 were test-manufactured by using the high-frequency oscillators, and in each device, an oscillation frequency f was regulated by the above method, the transmission-reception antenna 15 connected to the end portion of the third dielectric line 25 was removed, and a test terminal (test port) of a spectrum analyzer was connected to the end portion. As a result of measurement of frequency-modulated transmission high-frequency signals outputted from the connected portion in all of the 30 devices, it was confirmed that all of the 30 devices exhibited uniform oscillation frequencies of frequency-modulated transmission high-frequency signals (center frequencies of frequency modulation) and uniform frequency modulation widths and had good oscillation characteristics. In this example, the characteristics of the varactor diodes were relatively uniform, so that there was no need to regulate the frequency modulation widths.

Finally, a radar apparatus having the high-frequency transmission-reception apparatus was configured; and a radar detection test of detecting a detection object approaching the radar apparatus was performed, with the result that it was confirmed that the radar apparatus tuned in the aforementioned manner so that the high-frequency oscillator properly operated outputted distance information speedily, securely and stably.

Thus, according to the invention, a high-frequency oscillator in which a bias supply circuit of a variable-capacitance element as a component of the high-frequency oscillator had a pre-set variable resistor, and which could tune oscillation characteristics such as an oscillation frequency and a frequency modulation width to a desired state with the pre-set variable resistor and could stably exhibit good oscillation characteristics was realized. Moreover, the high-frequency transmission-reception apparatus using the high-frequency oscillator became a high-performance one.

The invention is not limited to the foregoing embodiments or example, and there is nothing against adding a variety of changes within the scope of the invention. For example, the bias supply circuit 53 of the Gunn diode 52 may have a pre-set variable resistor that regulates a bias voltage applied to the Gunn diode 52. In this case, a high-frequency oscillator that can regulate an oscillation output and a load characteristic as well is realized. Moreover, a pre-set variable resistor such that a contact of a fixed resistor network with a plurality of fixed resistors connected is switched by a relay may be used. In this case, it is possible to dynamically set the resistance value of the fixed resistor network, and, for example, it becomes possible to dynamically change the bias voltage of the high-frequency oscillator 11 so that the operation of the high-frequency oscillator 11 becomes proper in accordance with a change of environmental conditions, or it becomes possible to change the bias voltage of the high-frequency oscillator 11 in synchronism with the operation of the modulator 13.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A high-frequency oscillator comprising:
a high-frequency oscillation element for generating high-frequency signals;
a variable-capacitance element of which capacitance changes by applying a bias voltage;
a resonator connected to the high-frequency oscillation element, of which oscillation frequency changes along with the change of the capacitance of the variable-capacitance element; and
a bias supply circuit connected to the variable-capacitance element, for supplying a bias voltage to be applied to the variable-capacitance element, the bias supply circuit including a pre-set variable resistor for regulating the bias voltage.

2. The high-frequency oscillator of claim 1, wherein the pre-set variable resistor is composed of a trimmable chip resistor.

3. The high-frequency oscillator of claim 1, wherein the bias supply circuit includes a test terminal for applying a test bias voltage to the variable-capacitance element.

4. A high-frequency transmission-reception apparatus comprising:
the high-frequency oscillator of claim 1;

a selecting device having two output portions, connected to the high-frequency oscillator, for selectively outputting high-frequency signals given by the high-frequency oscillator from one or both of the output portions;

a signal separating device having a first terminal, a second terminal and a third terminal, for receiving at the first terminal the transmission high-frequency signals from the selecting device, for outputting from the second terminal the high-frequency signals inputted from the first terminal, and for outputting from the third terminal high-frequency signals inputted from the second terminal;

a transmission-reception antenna connected to the second terminal; and a mixer connected to the other output portion and the third terminal, for mixing high-frequency signals outputted from the other output portion and high-frequency signals received by the transmission-reception antenna and outputting intermediate frequency signals.

5. A high-frequency transmission-reception apparatus comprising:

the high-frequency oscillator of claim 1;

a selecting device having two output portions, connected to the high-frequency oscillator, for selectively outputting high-frequency signals given by the high-frequency oscillator from one or both of the output portions;

a transmission antenna connected to the one output portion;

a reception antenna; and a mixer connected to the other output portion and the reception antenna, for mixing high-frequency signals outputted from the other output portion and high-frequency signals received by the reception antenna and outputting intermediate frequency signals.

6. A high-frequency transmission-reception apparatus comprising:

the high-frequency oscillator of claim 1;

a branching device having two output portions, connected to the high-frequency oscillator, for branching high-frequency signals given by the high-frequency oscillator and outputting branched high-frequency signals from one or both of the output portions;

a signal separating device having a first terminal, a second terminal and a third terminal, for receiving at the first terminal the transmission high-frequency signals from the one output portion of the branching device, for outputting from the second terminal the transmission high-frequency signals inputted from the first terminal, and for outputting from the third terminal the high-frequency signals inputted from the second terminal;

a transmission-reception antenna connected to the second terminal; and a mixer connected to the other output portion and the third terminal, for mixing branched high-frequency signals outputted from the other output portion and high-frequency signals received by the transmission-reception antenna and outputting intermediate frequency signals.

7. A high-frequency transmission-reception apparatus comprising:

the high-frequency oscillator of claim 1;

a branching device connected to the high-frequency oscillator, for branching high-frequency signals given by the high-frequency oscillator and outputting the high-frequency signals from one or both of the output portions;

a transmission antenna connected to the one output portion;

a reception antenna; and a mixer connected to the other output portion and the reception antenna, for mixing branched high-frequency signals outputted from the other output portion and high-frequency signals received by the reception antenna and outputting intermediate frequency signals.

8. A radar apparatus comprising:

the high-frequency transmission-reception apparatus of claim 4; and a distance information detector that processes the intermediate frequency signals outputted from the high-frequency transmission-reception apparatus and detects information on the distance to a detection object.

9. A radar apparatus comprising:

the high-frequency transmission-reception apparatus of claim 5; and a distance information detector that processes the intermediate frequency signals outputted from the high-frequency transmission-reception apparatus and detects information on the distance to a detection object.

10. A radar apparatus comprising:

the high-frequency transmission-reception apparatus of claim 6; and a distance information detector that processes the intermediate frequency signals outputted from the high-frequency transmission-reception apparatus and detects information on the distance to a detection object.

11. A radar apparatus comprising:

the high-frequency transmission-reception apparatus of claim 7; and a distance information detector that processes the intermediate frequency signals outputted from the high-frequency transmission-reception apparatus and detects information on the distance to a detection object.

12. A radar-apparatus-equipped vehicle comprising the radar apparatus of claim 8, the radar apparatus being used for detection of a detection object.

13. A radar-apparatus-equipped vehicle comprising the radar apparatus of claim 9, the radar apparatus being used for detection of a detection object.

14. A radar-apparatus-equipped vehicle comprising the radar apparatus of claim 10, the radar apparatus being used for detection of a detection object.

15. A radar-apparatus-equipped vehicle comprising the radar apparatus of claim 11, the radar apparatus being used for detection of a detection object.

16. A radar-apparatus-equipped small boat comprising the radar apparatus of claim 8, the radar apparatus being used for detection of a detection object.

17. A radar-apparatus-equipped small boat comprising the radar apparatus of claim 9, the radar apparatus being used for detection of a detection object.

18. A radar-apparatus-equipped small boat comprising the radar apparatus of claim 10, the radar apparatus being used for detection of a detection object.

19. A radar-apparatus-equipped small boat comprising the radar apparatus of claim 11, the radar apparatus being used for detection of a detection object.

* * * * *